(12) United States Patent
Dubrow et al.

(10) Patent No.: US 8,623,288 B1
(45) Date of Patent: Jan. 7, 2014

(54) APPARATUS AND METHODS FOR HIGH DENSITY NANOWIRE GROWTH

(75) Inventors: Robert S. Dubrow, San Carlos, CA (US); Carlos Casillas, Santa Cruz, CA (US)

(73) Assignee: Nanosys, Inc., Milpitas, CA (US)

( * ) Notice: Subject to any disclaimer, the term of this patent is extended or adjusted under 35 U.S.C. 154(b) by 863 days.

(21) Appl. No.: 12/824,485

(22) Filed: Jun. 28, 2010

Related U.S. Application Data

(60) Provisional application No. 61/221,501, filed on Jun. 29, 2009.

(51) Int. Cl.
| | | |
|---|---|---|
| *B01J 8/02* | (2006.01) | |
| *B01J 35/02* | (2006.01) | |
| *B01J 19/00* | (2006.01) | |
| *B01J 8/00* | (2006.01) | |
| *C01B 31/00* | (2006.01) | |
| *C01B 31/02* | (2006.01) | |
| *D01F 9/00* | (2006.01) | |

(52) U.S. Cl.
USPC ........... 422/222; 422/129; 422/187; 422/211; 423/414; 423/445 R; 423/445 B

(58) Field of Classification Search
USPC .................. 422/129, 187, 211, 222; 977/700; 423/414, 445 R, 445 B, 449.1
See application file for complete search history.

(56) References Cited

U.S. PATENT DOCUMENTS

| | | | |
|---|---|---|---|
| 5,196,396 A | 3/1993 | Lieber et al. | |
| 5,332,910 A | 7/1994 | Haraguchi et al. | |
| 5,505,928 A | 4/1996 | Alivisatos et al. | |
| 5,512,131 A | 4/1996 | Kumar et al. | |
| 5,674,592 A | 10/1997 | Clark et al. | |
| 5,690,807 A | 11/1997 | Clark, Jr. et al. | |
| 5,840,435 A | 11/1998 | Lieber et al. | |
| 5,858,862 A | 1/1999 | Westwater et al. | |
| 5,897,945 A | 4/1999 | Lieber et al. | |
| 5,962,863 A | 10/1999 | Russell et al. | |
| 5,976,957 A | 11/1999 | Westwater et al. | |
| 5,997,832 A | 12/1999 | Lieber et al. | |
| 6,036,774 A | 3/2000 | Lieber et al. | |
| 6,048,616 A | 4/2000 | Gallagher et al. | |
| 6,068,800 A | 5/2000 | Singh et al. | |
| 6,130,142 A | 10/2000 | Westwater et al. | |
| 6,130,143 A | 10/2000 | Westwater et al. | |

(Continued)

FOREIGN PATENT DOCUMENTS

| | | |
|---|---|---|
| JP | 2001-288626 A | 10/2001 |
| WO | 9629629 | 9/1996 |

(Continued)

OTHER PUBLICATIONS

Cao, YW. et al. "Growth and Properties of Semiconductor Core/Shell Nanocrystals with InAs Cores" J. Am. Chem. Soc. (2000) 122:9692-9702.

(Continued)

*Primary Examiner* — Walter D Griffin
*Assistant Examiner* — Natasha Young
(74) *Attorney, Agent, or Firm* — Andrew L. Filler

(57) ABSTRACT

Methods and apparatus for high density nanowire growth are presented. Methods of making a nanowire growth cartridge assembly are also provided, as are nanowire growth cartridge assemblies.

13 Claims, 23 Drawing Sheets

(56) References Cited

U.S. PATENT DOCUMENTS

| | | | |
|---|---|---|---|
| 6,132,874 A | 10/2000 | Fischer et al. |
| 6,136,156 A | 10/2000 | El-Shall et al. |
| 6,146,227 A | 11/2000 | Mancevski |
| 6,190,634 B1 | 2/2001 | Lieber et al. |
| 6,207,229 B1 | 3/2001 | Bawendi et al. |
| 6,225,198 B1 | 5/2001 | Alivisatos et al. |
| 6,235,675 B1 | 5/2001 | McIlroy |
| 6,256,767 B1 | 7/2001 | Kuekes et al. |
| 6,261,469 B1 | 7/2001 | Zakhidov et al. |
| 6,274,007 B1 | 8/2001 | Smirnov et al. |
| 6,294,450 B1 | 9/2001 | Chen et al. |
| 6,306,734 B1 | 10/2001 | Givargizov |
| 6,306,736 B1 | 10/2001 | Alivisatos et al. |
| 6,322,901 B1 | 11/2001 | Bawendi et al. |
| 6,339,281 B2 | 1/2002 | Lee et al. |
| 6,361,861 B2 | 3/2002 | Gao et al. |
| 6,380,103 B2 | 4/2002 | Gonzalez et al. |
| 6,413,489 B1 | 7/2002 | Ying et al. |
| 6,465,132 B1 | 10/2002 | Jin |
| 6,471,761 B2 | 10/2002 | Fan et al. |
| 6,495,258 B1 | 12/2002 | Chen et al. |
| 6,515,325 B1 | 2/2003 | Farnworth et al. |
| 6,515,339 B2 | 2/2003 | Shin et al. |
| 6,586,785 B2 | 7/2003 | Flagan et al. |
| 6,656,573 B2 | 12/2003 | Chen et al. |
| 6,773,616 B1 | 8/2004 | Chen et al. |
| 6,790,425 B1 | 9/2004 | Smalley et al. |
| 6,803,260 B2 | 10/2004 | Shin et al. |
| 6,808,605 B2 | 10/2004 | Jang et al. |
| 6,831,017 B1 | 12/2004 | Li et al. |
| 6,846,565 B2 | 1/2005 | Korgel et al. |
| 6,872,645 B2 | 3/2005 | Duan et al. |
| 6,878,871 B2 | 4/2005 | Scher et al. |
| 6,882,051 B2 | 4/2005 | Majumdar et al. |
| 6,888,208 B2 | 5/2005 | Osipov et al. |
| 6,962,823 B2 | 11/2005 | Empedocles et al. |
| 6,996,147 B2 | 2/2006 | Majumdar et al. |
| 7,051,945 B2 | 5/2006 | Empedocles et al. |
| 7,056,409 B2 | 6/2006 | Dubrow |
| 7,057,881 B2 | 6/2006 | Chow et al. |
| 7,064,372 B2 | 6/2006 | Duan et al. |
| 7,067,328 B2 | 6/2006 | Dubrow et al. |
| 7,067,867 B2 | 6/2006 | Duan et al. |
| 7,081,385 B2 | 7/2006 | Farnworth et al. |
| 7,091,120 B2 | 8/2006 | Buretea et al. |
| 7,097,820 B2 | 8/2006 | Colbert et al. |
| 7,105,428 B2 | 9/2006 | Pan et al. |
| 7,129,554 B2 | 10/2006 | Lieber et al. |
| 7,135,728 B2 | 11/2006 | Duan et al. |
| 7,211,464 B2 | 5/2007 | Lieber et al. |
| 7,218,004 B2 | 5/2007 | Pan et al. |
| 7,233,041 B2 | 6/2007 | Duan et al. |
| 7,649,192 B2 | 1/2010 | Choi et al. |
| 2001/0033796 A1 | 10/2001 | Unger et al. |
| 2001/0051367 A1 | 12/2001 | Kiang |
| 2002/0004136 A1 | 1/2002 | Gao et al. |
| 2002/0014667 A1 | 2/2002 | Shin et al. |
| 2002/0072577 A1 | 6/2002 | Jacobsen et al. |
| 2002/0127495 A1 | 9/2002 | Scherer |
| 2002/0130311 A1 | 9/2002 | Lieber et al. |
| 2002/0130353 A1 | 9/2002 | Lieber et al. |
| 2002/0158342 A1 | 10/2002 | Tuominen et al. |
| 2002/0172820 A1 | 11/2002 | Majumdar et al. |
| 2002/0175408 A1 | 11/2002 | Majumdar et al. |
| 2002/0179434 A1 | 12/2002 | Dai et al. |
| 2003/0037675 A1 | 2/2003 | Gillingham et al. |
| 2003/0044777 A1 | 3/2003 | Beattie |
| 2003/0071246 A1 | 4/2003 | Grigorov |
| 2003/0089899 A1 | 5/2003 | Lieber et al. |
| 2003/0121887 A1 | 7/2003 | Garvey et al. |
| 2003/0184357 A1 | 10/2003 | Dijon et al. |
| 2003/0185741 A1 | 10/2003 | Matyjaszewski et al. |
| 2003/0186522 A1 | 10/2003 | Duan et al. |
| 2003/0189202 A1 | 10/2003 | Li et al. |
| 2003/0195611 A1 | 10/2003 | Greenhalgh et al. |
| 2003/0200521 A1 | 10/2003 | DeHon et al. |
| 2003/0222019 A1 | 12/2003 | Fulton et al. |
| 2003/0232721 A1 | 12/2003 | Zhou et al. |
| 2004/0005258 A1 | 1/2004 | Fonash et al. |
| 2004/0005723 A1 | 1/2004 | Empedocles et al. |
| 2004/0026684 A1 | 2/2004 | Empedocles |
| 2004/0061422 A1 | 4/2004 | Avouris et al. |
| 2004/0063839 A1 | 4/2004 | Kawate et al. |
| 2004/0095658 A1 | 5/2004 | Buretea et al. |
| 2004/0112964 A1 | 6/2004 | Empedocles et al. |
| 2004/0118448 A1 | 6/2004 | Scher et al. |
| 2004/0121681 A1 | 6/2004 | Lindsay et al. |
| 2004/0135951 A1 | 7/2004 | Stumbo et al. |
| 2004/0146560 A1 | 7/2004 | Whiteford et al. |
| 2004/0147098 A1 | 7/2004 | Mazen et al. |
| 2004/0206448 A1 | 10/2004 | Dubrow |
| 2004/0213307 A1 | 10/2004 | Lieber et al. |
| 2005/0011431 A1 | 1/2005 | Samuelson et al. |
| 2005/0026526 A1 | 2/2005 | Verdegan et al. |
| 2005/0029678 A1 | 2/2005 | Hanrath et al. |
| 2005/0038498 A1 | 2/2005 | Dubrow et al. |
| 2005/0062033 A1 | 3/2005 | Ichihara et al. |
| 2005/0066883 A1 | 3/2005 | Dubrow et al. |
| 2005/0079659 A1 | 4/2005 | Duan et al. |
| 2005/0089467 A1 | 4/2005 | Grill et al. |
| 2005/0145596 A1 | 7/2005 | Metz et al. |
| 2005/0176228 A1 | 8/2005 | Fonash et al. |
| 2005/0181195 A1 | 8/2005 | Dubrow |
| 2005/0187605 A1 | 8/2005 | Greenhalgh et al. |
| 2005/0191774 A1 | 9/2005 | Li et al. |
| 2005/0230356 A1 | 10/2005 | Empedocles et al. |
| 2005/0266662 A1 | 12/2005 | Yi |
| 2005/0279274 A1 | 12/2005 | Niu et al. |
| 2006/0006463 A1 | 1/2006 | Islam et al. |
| 2006/0008942 A1 | 1/2006 | Chen et al. |
| 2006/0009003 A1 | 1/2006 | Romano et al. |
| 2006/0019470 A1 | 1/2006 | Seifert et al. |
| 2006/0019472 A1 | 1/2006 | Pan et al. |
| 2006/0057360 A1 | 3/2006 | Samuelson et al. |
| 2006/0159916 A1 | 7/2006 | Dubrow et al. |
| 2006/0175601 A1 | 8/2006 | Lieber et al. |
| 2006/0255481 A1 | 11/2006 | Pan et al. |
| 2007/0004225 A1 | 1/2007 | Lu et al. |
| 2007/0037365 A1 | 2/2007 | Ranganath et al. |
| 2007/0084797 A1 | 4/2007 | Cooper et al. |
| 2008/0213603 A1* | 9/2008 | Kobayashi et al. ........... 428/450 |
| 2009/0311166 A1* | 12/2009 | Hart et al. ................. 423/445 B |

FOREIGN PATENT DOCUMENTS

| | | |
|---|---|---|
| WO | 0063115 | 10/2000 |
| WO | 0108781 | 2/2001 |
| WO | 02017362 | 2/2002 |
| WO | 02048701 | 6/2002 |
| WO | 02080280 | 10/2002 |
| WO | 03085700 | 10/2003 |
| WO | 03085701 | 10/2003 |
| WO | 2004032191 | 4/2004 |
| WO | 2004032193 | 4/2004 |
| WO | 2005023923 | 3/2005 |

OTHER PUBLICATIONS

Chung, S-W. et al., "Silicon Nanowire Devices" App. Phys. Letts. (2000) 76(15):2068-2070.

Cui, Y. et al. "Diameter-controlled synthesis of single-crystal silicon nanowires" Appl. Phys. Lett. (2001) 78:2214-2216.

Dabbousi, B.O. et al., "(CdSe)ZnS core-shell quantum dots: Synthesis and characterization of a size series of highly luminescent nanocrystallites" J. Phys. Chem. B (1997) 101:9463-9475.

De Los Arcos, T. et al. "Is aluminum a suitable buffer layer for carbon nanotube growth?" Chem Phys Letts (2003) 380:419-423.

Duan, X. et al., "General synthesis of compound semiconductor nanowires" Adv. Mater. (2000) 12:298-302.

Givargizov, E.I. "Fundamental Aspects of VLS Growth" J. Cryst. Growth (1975) 31:20-30.

Greene, L.E. et al. "Low-temperature wafer-scale production of ZnO Nanowire Arrays" Angew. Chem. (2003) 42:3031-3034.

(56) References Cited

OTHER PUBLICATIONS

Gudiksen, M.S. et al "Diameter-selective synthesis of semiconductor nanowires" J. Am. Chem. Soc. (2000) 122:8801-8802.

Gudiksen, M.S. et al. "Growth of nanowire superlattice structures for nanoscale photonics and electronics" Nature (2002) 415:617-620.

Gudiksen, M.S. et al. "Synthetic control of the diameter and length of single crystal semiconductor nanowires" J. Phys. Chem. B (2001) 105:4062-4064.

Haraguchi, K. et al., "Self Organized Fabrication of Planar GaAs Nanowhisker Arrays" Appl. Phys. Lett. (1996) 69 (3):386-387.

Hiruma, K. et al., "GaAs Free Standing Quantum Sized Wires" J. Appl. Phys. (1993) 74(5):3162-3171.

Hofmann, S. et al., "Gold Catalyzed Growth of Silicon Nanowires by Plasma Enhanced Chemical Vapor Deposition," J. Appl. Phys.(2003) 94:6005-6012.

Huang, Y. et al., "Directed Assembly of One-Dimensional Nanostructures into Functional networks" Science (2001) 291:630-633.

Jun, Y-W. et al. "Controlled synthesis of multi-armed CdS nanorod architectures using monosurfactant system" J. Am. Chem. Soc. (2001) 123:5150-5151.

Kong, J. et al., "Chemical vapor deposition of methane for single-walled carbon nanotubes" Chem. Phys. Lett.(1998) 292:567-574.

Kong, J. et al., "Synthesis of individual single-walled carbon nanotubes on patterned silicon wafers" Nature (1998) 395:878-881.

Liu, C. et al. "Sol-Gel Synthesis of Free-Standing Ferroelectric Lead Zirconate Titanate Nanoparticles" J. Am. Chem. Soc. (2001) 123:4344-4345.

Manna, L. et al. "Epitaxial growth and photochemical annealing of graded Cds/ZnS shells on colloidal CdSe nanorods" J. Am. Chem. Soc. (2002) 124:7136-7145.

Manna, L. et al. "Synthesis of soluble and processable rod-, arrow-, teardrop-, and tetrapod-shaped CdSe nanocrystals" J. Am. Chem. Soc. (2000) 122:12700-12706.

Martin, C.R., "Nanomaterials: A membrane-based synthetic approach" Science 266:1961-1966.

Peng, X. et al. "Epitaxial growth of highly luminescent CdSe/CdS core/shell nanocrystals with photostability and electronic accessibility" J. Am. Chem. Soc. (1997) 119:7019-7029.

Peng, X. et al. "Shape Control of CdSe Nanocrystals" Nature (2000) 404:59-61.

Rabin, O. et al., "Formation of thick porous anodic alumina films and nanowire arrays on silicon wafers and glass" Adv. Func. Mater. (2003) 13(8):631-638.

Sharma, S. et al. "Diameter control if Ti-catalyzed silicon nanowires" J. Cryst. Growth (2004) 267:613-618.

Swihart, M.T. et al. "On the mechanism of homogeneous decomposition of the chlorinated silanes. Chain reactions propogated by divalent silicon species" J. Phys. Chem. A (1998) 102:1542-1549.

Tang, T. et al., "Synthesis of InN Nanowires Using a Two-Zone Chemical Vapor Deposition Approach" IEEE (Aug. 14, 2003) 205-207.

Urban, J.J. et al. "Synthesis of single-crystalline perovskite nanowires composed of brium titanate and strontium titanate" J. Am. Chem. Soc. (2002) 124:1186-1187.

Wagner, R.S. et al., "Vapor-Liquid-Solid mechanism of single crystal growth" Appl. Phys. Lett. (1964) 4(5):89-90.

Wang, D. et al., "Low Temperature Synthesis of Single-Crystal Germanium Nanowires by Chemical Vapor Deposition" Angew. Chem. Int. Ed. (2002) 41(24):4783-4786.

Wu, Y. et al. "Block-by-block growth of single-crystalline Si/SiGe superlattice nanowires" Nano Lett (2002) 2:83-86.

Xiang, J. et al. "Ge/Si nanowire heterostructures as high-performance field-effect transistors" Nature (2006) 441:489-493.

Yazawa, M. et al. "Semiconductor nanowhiskers" Adv. Mater.(1993) 5(7/8):577-580.

* cited by examiner

APPARATUS AND METHODS FOR HIGH DENSITY NANOWIRE GROWTH

CROSS-REFERENCE TO RELATED APPLICATION

This application is a non-provisional utility patent application claiming priority to and benefit of the following prior provisional patent application: U.S. Ser. No. 61/221,501, filed Jun. 29, 2009, entitled "Apparatus and Methods for High Density Nanowire Growth" by Robert S. Dubrow et al., which is incorporated herein by reference in its entirety for all purposes.

BACKGROUND OF THE INVENTION

1. Field of the Invention

The present invention relates to nanowires, and more particularly, to nanowire manufacturing. The present invention also relates to the production of high density, high numbers of nanowires.

2. Background of the Invention

Nanomaterials possess very unique and highly desirable properties in terms of their chemical, structural and electrical capabilities. However, to date, there is very little technology available for integrating nanoscale materials into the macroscale world in a reasonable commercial fashion. Depending on application, nanowires may need to be substantially straight, oriented nanowires, such as those used in electronic circuits. In certain cases, however, uses of nanowires have been proposed that exploit the unique and interesting properties of these materials more as a bulk material (e.g., produced in grams or kilograms of material) than as individual elements requiring individual assembly.

Bulk nanowires have enormous potential in electrical, mechanical, and electro-mechanical applications. For example, bulk nanowires can be used to make coatings for medical devices and as catalyst supports in fuel cell applications. A major impediment to commercializing devices using bulk nanowires is the ability to mass produce the nanowires used in such devices.

Nanowires have been grown in chemical vapor deposition (CVD) furnaces primarily on glass and silicon wafers. Methods for increasing the quantity of nanowires grown per volume of furnace have focused on nanowires grown from powders, such as carbon black particles, using a fixed or fluidized bed and column approach. While powders provide a large surface area for nanowire growth, the particles may spill out of the column, and the precursor gases used may not flow uniformly through the column. In addition, non-uniform gas flow may cause silicon deposits to form on the particles, thereby causing the particles to stick together, leaving little space on the particles for nanowire growth.

What are needed are apparatus and methods to efficiently manufacture a high density and high number of nanowires in a given growth chamber volume, using a minimal amount of precursor gas. The present application satisfies these and other needs, and provides further related advantages, as will be made apparent by the description of the embodiments that follow.

BRIEF SUMMARY OF THE INVENTION

The present invention provides methods and apparatus for growing nanowires in a bulk or bulk-like process. The methods and apparatus of the present invention are scalable to the volume of the nanowire growth chamber that is available, and allow for a high density of nanowires to be efficiently produced within the given volume.

In one embodiment, the present invention provides methods for producing nanowires. According to one embodiment, a cartridge assembly having a plurality of support layers is provided, and the cartridge assembly is placed in a nanowire growth chamber. A spacing between adjacent support layers is a set distance, and each support layer has opposing first and second surfaces. A plurality of catalysts are disposed on at least the first surface of each layer. The methods further include providing a precursor gas in the nanowire growth chamber, whereby nanowires grow on the first surface of each layer. In one embodiment, the precursor gas flows in a direction parallel to the surfaces and through the spacing between the support layers. The method may further include removing the cartridge assembly from the nanowire growth chamber and harvesting the nanowires.

The present invention also provides methods for making a nanowire growth cartridge assembly. According to one embodiment of the methods, a sheet of material comprising spacers, each of a set height, is provided. The sheet of material is formed into a coiled sheet of material having a longitudinal axis and a plurality of support layers extending around the longitudinal axis. The plurality of support layers each have opposing first and second surfaces and are spaced apart by distances corresponding to the heights of the spacers. A plurality of catalysts are disposed on at least the first surface of each support layer. In one embodiment, the sheet of material is embossed to generate the spacers.

A nanowire growth cartridge assembly is also provided. In one embodiment, the nanowire growth cartridge assembly comprises a plurality of support layers, wherein each support layer has opposing first and second surfaces. A plurality of catalysts are disposed on at least the first surface of each support layer. A spacing between adjacent support layers is a set distance. In one embodiment, a coiled sheet of material forms the support layers. The coiled sheet has a longitudinal axis, wherein the support layers extend around the longitudinal axis so as to be spaced apart by the set distance. In one embodiment, the coiled sheet of material comprises integrated spacers embossed on the coiled sheet, having a height substantially equal to the set distance between the support layers. The spacers are configured to space apart the support layers by the set distance.

Further embodiments, features, and advantages of the invention, as well as the structure and operation of the various embodiments of the invention are described in detail below with reference to accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The invention is described with reference to the accompanying drawings. In the drawings, like reference numbers indicate identical or functionally similar elements. The drawing in which an element first appears is indicated by the left-most digit in the corresponding reference number.

DETAILED DESCRIPTION OF THE INVENTION

Figure 1:
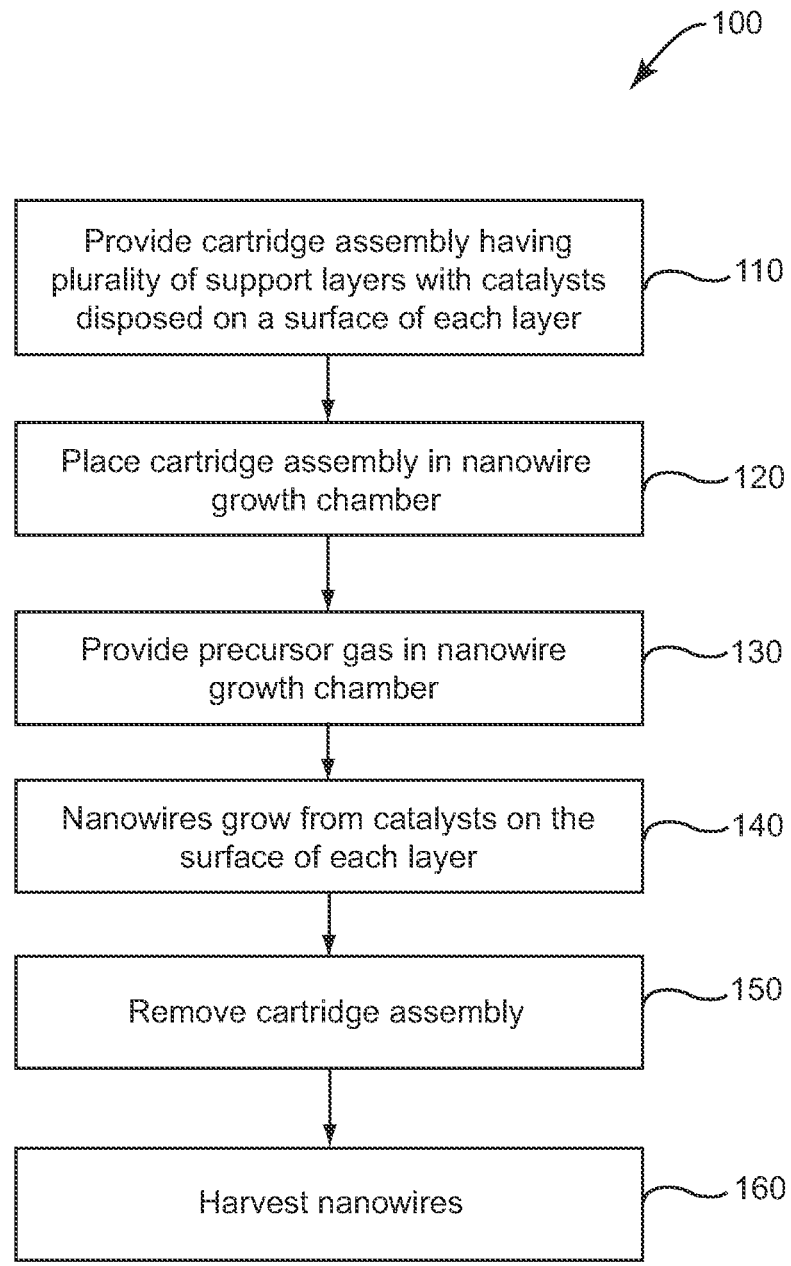
FIG. 1 is a flow chart depicting a method for producing nanowires, in accordance with an embodiment of the present invention.

It should be appreciated that the particular implementations shown and described herein are examples of the invention and are not intended to otherwise limit the scope of the present invention in any way. Indeed, for the sake of brevity, conventional electronics, manufacturing, semiconductor devices, and nanowire (NW), nanorod, nanotube, and nanoribbon technologies and other functional aspects of the systems (and components of the individual operating components of the systems) may not be described in detail herein. While the density of nanowire growth and total weight of harvested nanowires for a growth chamber volume are provided for the specific implementations discussed, the implementations are not intended to be limiting. The invention is scalable, and a wide range of densities and harvest weights can be achieved using the apparatus and methods described herein. It should be appreciated that although nanowires are frequently referred to, the techniques described herein are also applicable to nanorods, nanotubes, nanocrystals, nanowhiskers, nanotetrapods, nanoribbons, etc.

As used herein, the term "nanowire" generally refers to any elongated conductive or semiconductive material (or other material described herein) that includes at least one cross-sectional dimension that is less than about 1 µm. Suitably, a nanowire produced according to the present invention will be less than about 500 nm, less than about 300 nm, less than about 200 nm, and less than about 100 nm in diameter. In suitable embodiments, nanowires of the present invention have an aspect ratio (length:width) of greater than about 10, suitably greater than about 50, and more suitably greater than about 100. As used herein, when referring to any numerical value, "about" means a value of ±10% of the stated value (e.g., "about 100 nm" encompasses a range of sizes from 90 nm to 110 nm, inclusive). Examples of such nanowires include semiconductor nanowires as described in Published International Patent Application Nos. WO 02/17362, WO 02/48701, and WO 01/03208, carbon nanotubes, and other elongated conductive or semiconductive structures of like dimensions.

While suitable nanowire materials include CdS and Si, other types of materials for nanowires can be used, including semiconductive nanowires, that are comprised of semiconductor material selected from, e.g., Si, Ge, Sn, Se, Te, B, C (including diamond), P, B—C, B—P(BP6), B—Si, Si—C, Si—Ge, Si—Sn and Ge—Sn, SiC, BN, BP, BAs, MN, AlP, AlAs, AlSb, GaN, GaP, GaAs, GaSb, InN, InP, InAs, InSb, ZnO, ZnS, ZnSe, ZnTe, CdS, CdSe, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, AgF, AgCl, AgBr, AgI, BeSiN$_2$, CaCN$_2$, ZnGeP$_2$, CdSnAs$_2$, ZnSnSb$_2$, CuGeP$_3$, CuSi$_2$P$_3$, (Cu, Ag) (Al, Ga, In, Tl, Fe) (S, Se, Te)$_2$, Si$_3$N$_4$, Ge$_3$N$_4$, Al$_2$O$_3$, (Al, Ga, In)$_2$ (S, Se, Te)$_3$, Al$_2$CO, and an appropriate combination of two or more such semiconductors.

In certain aspects, the semiconductor may comprise a dopant from a group consisting of: a p-type dopant from Group III of the periodic table; an n-type dopant from Group V of the periodic table; a p-type dopant selected from a group consisting of: B, Al and In; an n-type dopant selected from a group consisting of: P, As and Sb; a p-type dopant from Group II of the periodic table; a p-type dopant selected from a group consisting of: Mg, Zn, Cd and Hg; a p-type dopant from Group IV of the periodic table; a p-type dopant selected from a group consisting of: C and Si; or an n-type dopant selected from a group consisting of: Si, Ge, Sn, S, Se and Te.

Additionally, the nanowires can include carbon nanotubes, or nanotubes formed of conductive or semiconductive organic polymer materials, (e.g., pentacene, and transition metal oxides).

Hence, although the term "nanowire" is referred to throughout the description herein for illustrative purposes, it is intended that the description herein also encompass the use of nanotubes (e.g., nanowire-like structures having a hollow tube formed axially therethrough). Nanotubes can be formed in combinations/thin films of nanotubes as is described herein for nanowires, alone or in combination with nanowires, as may be desired for a particular application.

Furthermore, it is noted that the nanowires grown on a substrate can be a "heterogeneous" so as to incorporate nanowires and/or nanotubes, and/or nanorods, and/or nanoribbons, and/or any combination thereof of different composition and/or structural characteristics. For example, a "heterogeneous film" of nanowires can include nanowires/nanotubes with varying diameters and lengths, and nanotubes and/or nanotubes that are "heterostructures" having varying characteristics.

As used herein, the term "dispose" is used herein in connection with catalysts to indicate that the catalysts are generated, deposited, coated, applied, layered, sprayed or otherwise placed in contact with a surface or substrate.

It should be understood that the spatial descriptions (e.g., "above," "below," "up," "down," "top," "bottom," etc.) made herein are for purposes of illustration only, and that devices of the present invention can be spatially arranged in any orientation or manner.

FIG. 1 shows a flow chart 100 of a method for producing nanowires in accordance with an embodiment of the present invention. In step 110, a cartridge assembly is provided having a plurality of support layers, which serve as substrates for nanowire growth, with catalysts disposed on a surface of each layer. In step 120, the cartridge is placed in a nanowire growth chamber. FIGS. 2-5, 7, 8, and 11-13, which will be described in further detail below, show several non-limiting embodiments of cartridge assemblies for nanowire growth and examples of the placement of a cartridge assembly in a nanowire growth chamber. The method of flow chart 100 further includes providing one or more precursor gases in the growth chamber (step 130), whereby nanowires grow from the catalysts on the support layers (step 140).

The method of flowchart 100 may further include the steps of removing the cartridge assembly from the nanowire growth chamber (step 150), and harvesting the nanowires (step 160).

Growth of nanowires from catalysts can be accomplished via any method known to those skilled in the art. Suitably, chemical vapor deposition (CVD) is used, wherein the catalysts are contacted with one or more precursor gas mixtures to initiate and promote nanowire growth from catalysts on the surface of each support layer (see steps 130 and 140 of flowchart 100 of FIG. 1). CVD comprises heating a precursor gas mixture to a temperature at which 1) the gas dissociates into its free component atoms, and 2) catalysts (e.g., metal film or colloids) melts to a liquid. The free gas molecules can then diffuse into the metal to form a liquid alloy mixture. Such methods are also known as vapor-liquid-solid (VLS) synthesis methods.

Catalysts that may be used in the practice of the present invention include metal catalysts, metal colloids and metal films, and can be any metal that can react with precursor gas mixtures to form a eutectic phase. Such a phase has a minimum melting point at which all components are in solution. Upon addition of precursor gas molecules (e.g., silicon) a saturation point on the eutectic phase diagram is reached such that semiconductor particles (e.g., Si) begin to precipitate out of the metal solution, thereby creating a growing nanowire. Continuous addition of precursor gas will continue to saturate the eutectic, thereby generating additional material for nanowire growth.

In suitable embodiments, the catalysts will be metal films and can comprise any of the transition metals from the Periodic Table, including, but not limited to, copper, silver, gold, nickel, palladium, platinum, cobalt, rhodium, iridium, iron, ruthenium, tin, osmium, manganese, chromium, molybdenum, tungsten, vanadium, niobium, tantalum, titanium, zirconium and gallium, including mixtures of one or more of these metals. In suitable embodiments of the present invention, the metal films are gold (Au) films. In other embodiments, metallic colloids, such as gold particles, can be used. In certain embodiments, the metallic colloids will be on the order of 10's of nanometers in diameter, for example, about 60 nanometer (nm) diameter gold colloids can be used. Other diameter colloids are envisioned.

Typically, catalysts comprise metals, e.g., gold, and may be electroplated or evaporated onto the surface of the support layer or disposed in any of a number of other well known metal deposition techniques, e.g., sputtering, spraying, dipcoating etc. For example, catalysts used can be disposed on a support layer by heating a gold film layer coating the top surface of the substrate. In other embodiments, the catalysts can be formed as metallic colloids using methods known in the art (see e.g., U.S. Pat. Nos. 7,105,428 and 7,067,867, both of which are incorporated by reference herein in their entireties). In the case of colloid disposition, the colloids are typically disposed by first treating the surface of the substrate so that the colloids adhere to the surface. Such treatments include those known in the art, e.g., polylysine treatment, etc. The support layer with the treated surface is then immersed in a suspension of colloid. In one embodiment, atomic layer deposition (ALD) is used for disposing alumina on a metal (such as stainless steel) support layer, and then the support layer is boiled to convert the alumina to ensure it is positively charged. The treated surface is then immersed in a suspension of colloid. The negatively charged metallic colloids are electrostaticly attracted to the positively charged alumina and disposed thereon. Metallic colloids can also be disposed using methods such as polydimethylsiloxane patterning, followed by contact with metallic colloids, as known in the art.

In particular, in accordance with one synthesis technique, nanowires can be grown directly on a surface of each support layer using a colloidal catalyst based vapor-liquid-solid (VLS) synthesis method. Colloidal catalysts are disposed upon the desired surface, or portion thereof, of a support layer (which in some cases may include both opposing surfaces of a support layer). The support layer including the colloidal catalyst is then subjected to the synthesis process which generates nanowires attached to the support layer surface. Other synthetic methods include the use of thin catalyst films, e.g., 50 nm, disposed over a surface of the support layer. The heat of the VLS process then melts the film to form small droplets of catalyst that form the nanowires. Typically, this latter method may be employed where nanowire diameter homogeneity is less critical to the ultimate application.

In suitable embodiments of the present invention, the precursor gases can comprise a gas which includes at least one atomic species that promotes the growth of nanowires (e.g., Si) as well as an atomic species that aids in orienting the nanowires during their growth (e.g., Cl atoms). For example, the first precursor gas may be selected from, but not limited to, $Si_2H_6$, $SiH_4$, $SiCl_4$ and $SiH_2Cl_2$ gas, preferably $SiCl_4$ or $SiH_2Cl_2$. Heating these Si precursor gases above the temperature at which the thermal energy is sufficient to break the bond energies between the gaseous molecules generates free Si atoms. (e.g., Si—H bond: 93 kcal/mole, Si—Cl bond: 110 kcal/mole, Si—Si bond; 77 kcal/mole, see M. T. Swihart and R. W. Carr, *J. Phys Chem A* 102:1542-1549 (1998).) Provided that this temperature is also high enough to liquefy the metal, the free Si atoms will diffuse into the metal and generate a eutectic phase. Dissociation temperatures for $SiH_4$ and $Si_2H_6$, and $SiCl_4$ and $SiH_2Cl_2$ gases are between about 300° C. to about 500° C. (for $Si_2H_6$ and $SiH_4$), above about 800° C. ($SiCl_4$) and above about 600° C. ($SiH_2Cl_2$) respectively.

In instances when $SiCl_4$ or $SiH_2Cl_2$ are used, Cl atoms are also generated. Decomposition of $SiCl_4$ or $SiH_2Cl_2$ into Si and Cl in the presence of a carrier gas (e.g., $H_2$, $H_2Ar$) forms HCl. This creates a competition between etching with HCl and growth from the Si vapor.

However, because the decomposition of $SiCl_4$ or $SiH_2Cl_2$ into Si and Cl occurs at a relatively high temperature (e.g., above about 600° C.), metal diffusion into the growing nanowires is more likely to occur if the temperature is maintained above about 600° C. for an extended time period. Furthermore, at higher temperatures, the loss of metal catalyst is more likely to occur due to increased melting of the catalyst leaving less catalyst (or none) available to promote growth of the nanowires, thus limiting the length to which the nanowires can be grown. Accordingly, following the initiation of nanowire growth and orientation with $SiCl_4$ or $SiH_2Cl_2$, it is suitable to introduce another precursor gas mixture (including, e.g., $Si_2H_6$ or $SiH_4$) to contact the metal, which gas mixture includes a precursor gas which decomposes into Si atoms at lower temperatures than the first precursor gas (but at a high enough temperature to form a eutectic phase with the metal catalyst).

The present invention also encompasses the use of multiple precursor gas mixtures added in different combinations and at different temperatures. In all embodiments of the present invention, the precursor gas mixtures used during any of the nanowire growth processes may further comprise one or more doping gases.

Examples of suitable doping gases that may be used in the practice of the present invention include, but are not limited to, $B_2H_6$, $POCl_3$ and $PH_3$. Further disclosure of VLS processes and use of various precursor gas mixtures and temperatures can be found in U.S. Pat. No. 7,105,428, which is incorporated herein by reference.

Figure 2:
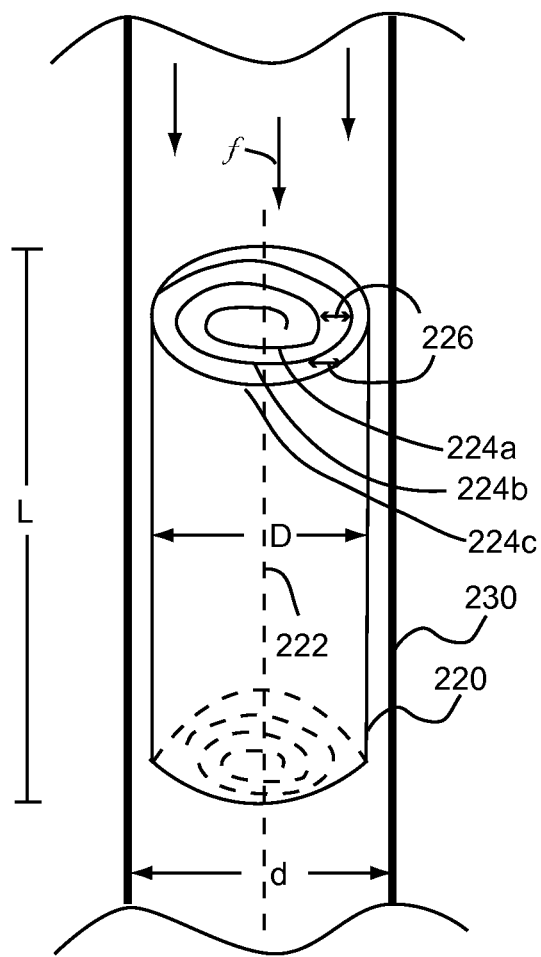
FIG. 2 is a schematic illustration showing a cartridge assembly in a nanowire growth chamber, in accordance with an embodiment of the present invention.

FIG. 2 illustrates a cartridge assembly 220 in a nanowire growth chamber 230 in accordance with one embodiment of the present invention. Cartridge assembly 220 includes a coiled sheet of material having a plurality (n) of support layers 224a, b, c . . . n, in which plurality of support layers 224 are spaced apart by a set distance 226. As used herein, "plurality" refers to two or more of an article (i.e., 2, 3, 4, 5, 10, 20, 30, 50, 100, 500, 1000 etc.). Each support layer 224 has opposing first and second surfaces (see surfaces 1012 and 1014 of FIGS. 10 and 11) on which a plurality of catalysts are disposed (see catalysts 442 illustrated in FIG. 11), either on one surface or both surfaces. In this embodiment, cartridge assembly 220 is cylindrical, having a diameter D, a length L, and a longitudinal axis 222. FIG. 2 shows cartridge assembly 220 inserted into growth chamber 230, such as a CVD furnace, so that longitudinal axis 222 of cartridge assembly 220 is parallel with the longitudinal axis of growth chamber 230. Further, nanowire growth chamber 230 has a cross-sectional shape that is substantially the same as the cross-sectional shape of cartridge assembly 220. For example, as shown in FIG. 2, nanowire growth chamber 230 has a diameter d that is only slightly larger than diameter D of cartridge assembly 220. One or more precursor gases are provided in nanowire growth chamber 230, and flow in a direction f (as shown by the arrows illustrated in FIG. 2) that is parallel with longitudinal axis 222 and the surfaces of support layers 224. It should be noted that flow direction f can also be in the opposite direction from that shown in FIG. 2.

The "set distance" is a predetermined distance between support layers that can vary about +/−20% from the predetermined distance to account for manufacturing error. Thus, the actual distance between the support layers may be in a range of about +/−20% of the predetermined distance. Support layers 224 are preferably spaced apart substantially evenly, to ensure uniform exposure of the catalysts to the precursor gas flowing between the spaced-apart layers. In the embodiment shown in FIG. 11, support layers 224 are spaced evenly apart (i.e., set distance 226 is substantially uniform), ensuring an even gas flow due to the uniformity of the spacing in the coil (i.e., cartridge assembly 220). A substantially uniform set distance means that the each set distance between adjacent support layers has a predetermined distance that is within about +/−20% of each other set distance between other adjacent support layers of the cartridge assembly.

Figure 11:
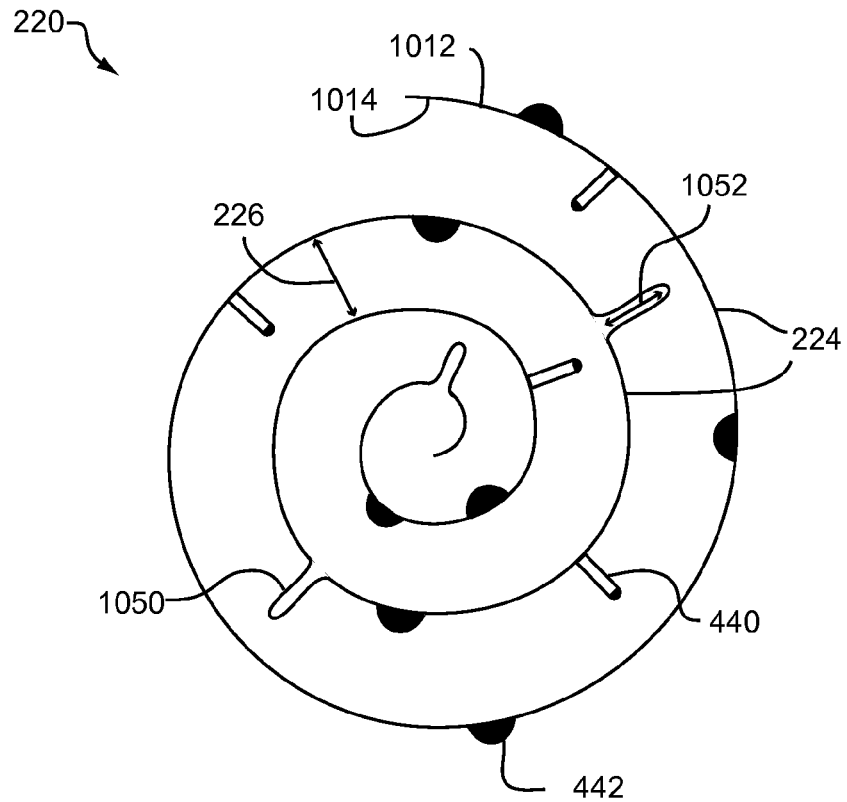
FIG. 11 is an axial view of the cartridge assembly of FIG. 2 prepared from the sheet of material of FIG. 10.

Cartridge assembly 220 has a cross-sectional shape that is substantially circular (see FIG. 11). As used herein, "substantially circular" refers to a curved shape in which every point on the curve is an equal distance from the center of the cross-section (i.e., uniform radii), or in which these distances vary by no more than a few % to about 20% across the curved shape. A substantially circular cross-section also includes oval cross-sections. In other embodiments, cartridge assembly 220 can have a cross-sectional shape that is substantially rectangular or polygonal, and can be formed in a shape that corresponds with the cross-sectional shape of a given nanowire growth chamber. Cartridge assembly 220 can be any diameter D and length L, limited only by the dimensions of growth chamber 230 in which it is ultimately to be used. For example, diameter D may range between 1-200 cm in one embodiment, 5-100 cm in another embodiment, 5-70 cm in another embodiment, and 7-60 cm in another embodiment. For example, length L may range between 1-200 cm in one embodiment, 3-150 cm in another embodiment, 5-75 cm in another embodiment, and 7-60 cm in another embodiment. By providing a growth substrate in the form of a coil, surface area for nanowire growth is maximized for a given volume of growth chamber 230. For example, a cartridge assembly of diameter D of 7.5 cm and length L of 10 cm, which is formed from coiling a sheet of material having a thickness of about 1.27 μm (0.0005 inches) and with the plurality of support layers being separated by a set distance of 30 μm, will have a total surface area for nanowire growth approaching 10 m².

Nanowires will grow from the surfaces of support layers 224 (see nanowires 440 illustrated in FIG. 11). After the growth process, cartridge assembly 220 can be removed from growth chamber 230, and the nanowires harvested, such as by sonication or mechanical means, or any other means known to one of skill in the art. Cartridge assembly 220 can then be cleaned and reused if desired, or the material of cartridge assembly can be recycled. Thus, cartridge assembly 220 provides easy handling, while still providing a high surface area in comparison with the conventional fluidized bed approach for growing a high density of nanowires.

As should be apparent to one of skill in the art, this process may be optimized to ensure maximum nanowire growth for a given precursor gas flow. For example, as wires grow from the surfaces, they will eventually fill the gaps (i.e., spacing) between support layers 224 and create flow resistance for the precursor gas flowing along the surfaces. The lengths achieved by the growing nanowires are typically less than the spacing between support layers, though can be longer as the wires bend or curve during growth. In one embodiment, precursor gas may be provided in a first direction for a first period of time (i.e., at the top end of from the bottom end of cartridge assembly 220 as shown in FIG. 2), and then in a second direction that is opposite the first direction (i.e., from the bottom end of cartridge assembly 220) for a second period of time. This ensures that both ends of cartridge assembly 220 are exposed to the precursor gas that has not been exhausted by the prior exposure of catalysts and growing wires upstream.

Other optimization techniques may include, for example, manipulating the heating profile along the longitudinal axis 222 of cartridge assembly 220 as well as preheating the precursor gas prior to providing it in the growth chamber 230.

Figure 3:
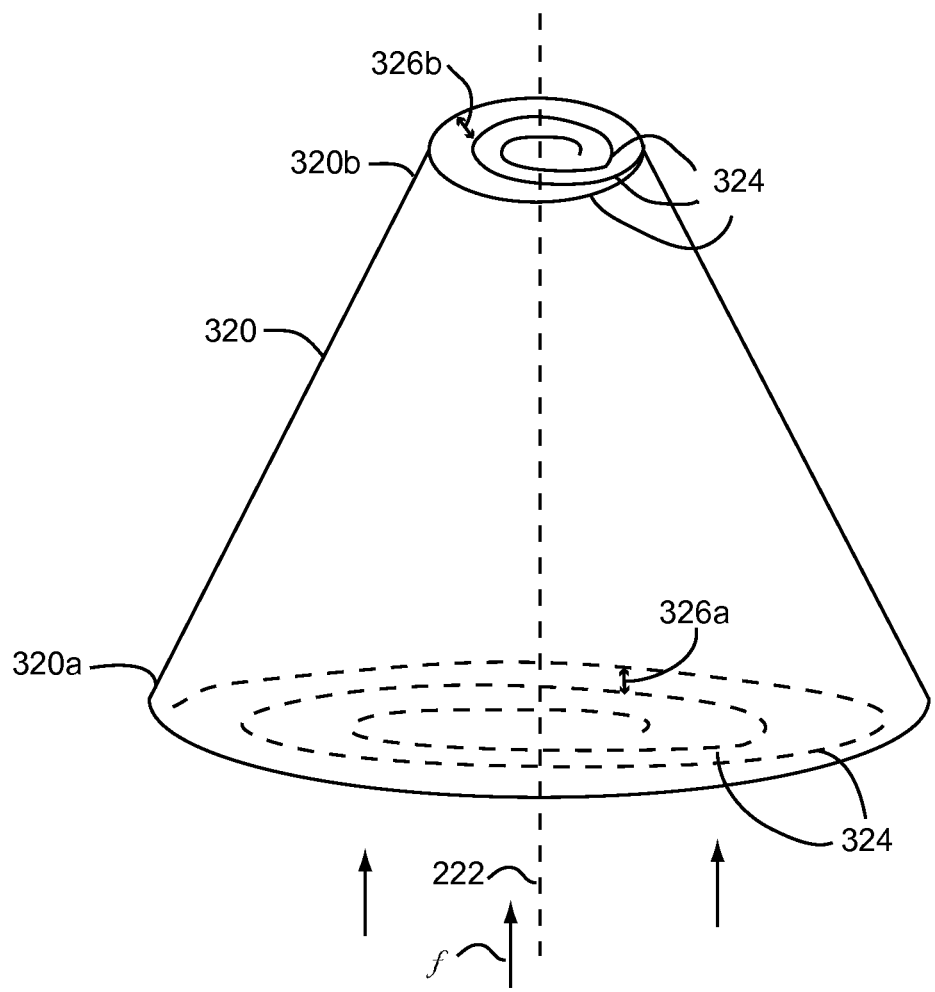
FIG. 3 is a schematic illustration of a cartridge assembly, in accordance with an embodiment of the present invention.

In another embodiment, shown in FIG. 3, a cartridge assembly 320 is formed from a sheet of material coiled in a cone shape, in which there is a smaller diameter at one end of the coiled sheet than a diameter at an opposite end of the coiled sheet. In this embodiment, cartridge assembly 320 is provided with a plurality of support layers 324 which are spaced apart at a smaller diameter end 320b of the coiled sheet by a spacing distance (set distance) 326b that is less than a spacing distance 326a between support layers 324 at an opposite, larger diameter end 320a. As with cartridge assembly 220, the precursor gas can be provided to flow parallel with longitudinal axis 222 of cartridge assembly 320, in the direction f as shown by the arrows illustrated in FIG. 3 (or can be in the opposite direction). Thus, the precursor gas flows from larger diameter end 320a to smaller diameter end 320b. Even as nanowires (not shown) grow and extend into spacing between support layers 324, larger spacing distance 326a between layers at larger diameter end 320a ensures there is less resistance to gas flow by the growing nanowires. Even if there is flow resistance and less exposure to the precursor gas at smaller diameter end 320b, the reduced distance 326b between adjacent layers 324 at smaller diameter end 320b correlates with a reduced surface area of each layer 324 at smaller diameter end 320b. Consequently, a reduced amount of the precursor gas may be required at smaller diameter end 320b, than at larger diameter end 320a. Further, for any given cross-section taken at a point along longitudinal axis 222, spacing distance 326 between layers at that section can be configured to be substantially uniform (resembling the uniform spacing illustrated in the axial view of cartridge assembly 220 of FIG. 11). The substantially uniform spacing ensures uniform exposure of the catalyst and growing wires to the precursor gas at a given cross section of the cartridge assembly 320.

Figure 12:
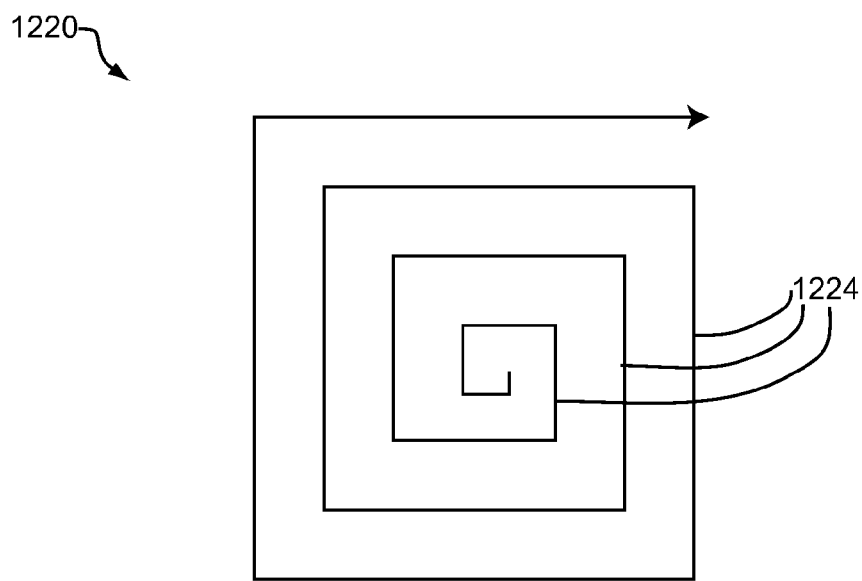
FIG. 12 is an axial view of a further cartridge assembly in accordance with an embodiment of the present invention.

A growth chamber may have a rectangular cross-section, rather than circular, and in this instance the methods of the present invention may include providing a cartridge assembly that has a corresponding rectangular shape. As noted above, in one embodiment, cartridge assembly 220 can have a rectangular cross-section (see, e.g., FIG. 12, illustrating a rectangular cartridge assembly 1220 comprised of a coiled sheet of material forming a plurality of support layers 1224).

Figure 4:
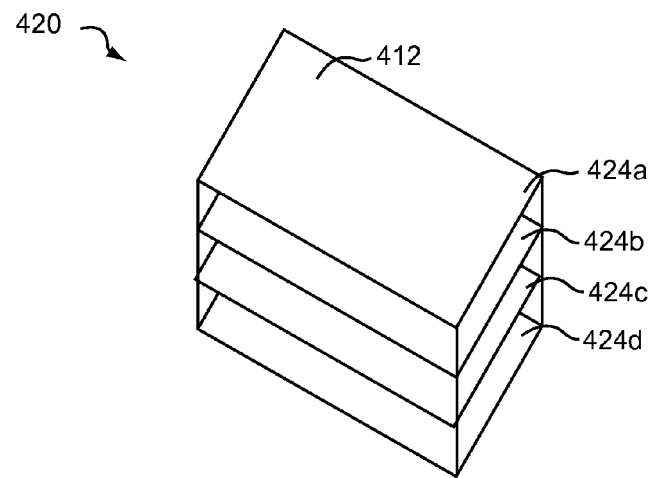
FIG. 4 is a schematic illustration of a still further cartridge assembly, in accordance with an embodiment of the present invention.
Figure 5:
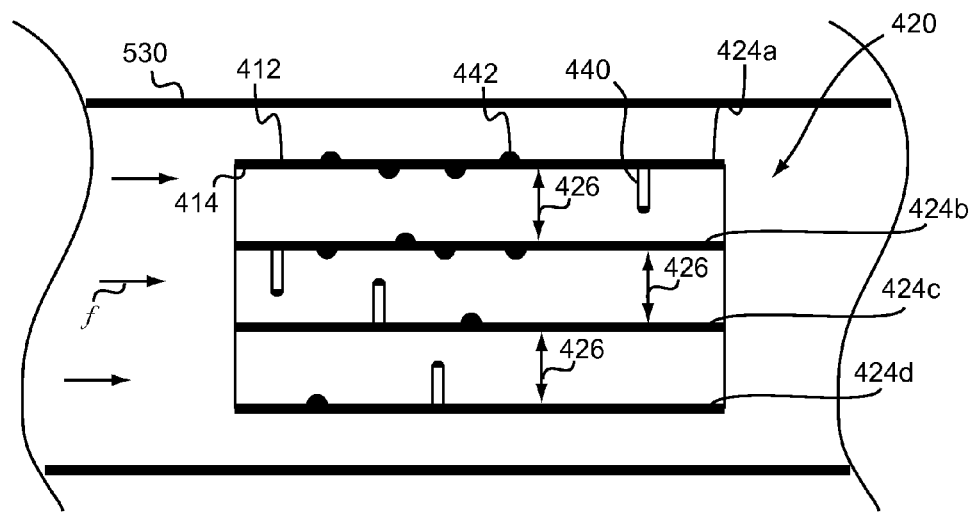
FIG. 5 is a schematic illustration showing an additional cartridge assembly in a nanowire growth chamber, in accordance with an embodiment of the present invention.
Figure 6A:
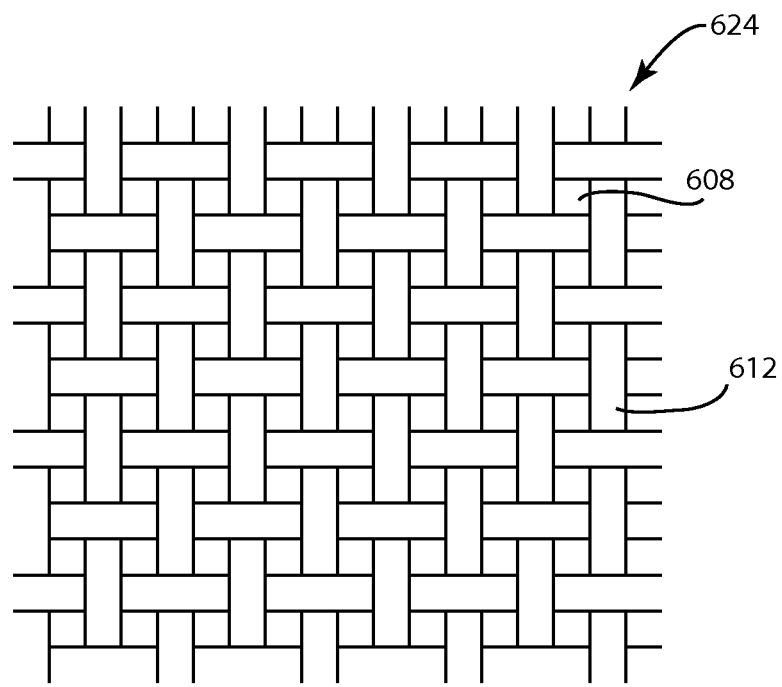
FIG. 6A is an enlarged view of a portion of a mesh screen of a cartridge assembly, in accordance with an embodiment of the present invention.
Figure 6B:
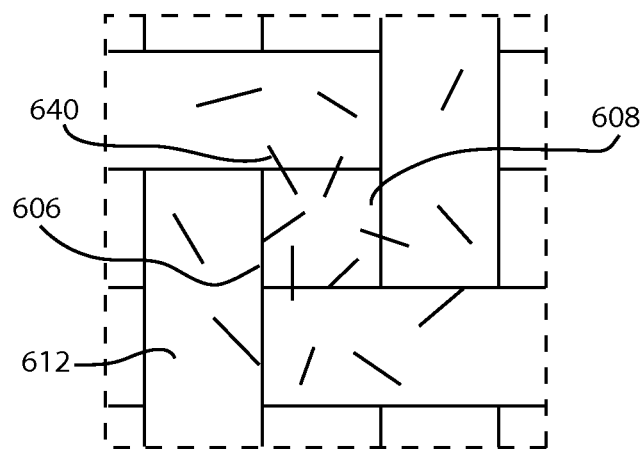
FIG. 6B is an enlarged view of the mesh screen of FIG. 6A, illustrating nanowires on its surfaces.

In another embodiment, a rectangular cartridge assembly has a plurality of parallel plates, as illustrated in FIGS. 4 and 5. As shown in FIG. 4, a cartridge assembly 420 includes a plurality (n) of parallel plates 424a-d, . . . n, in which each plate 424 has opposing first and second surfaces 412, 414 (see FIG. 5). As shown in FIG. 5, parallel plates 424 are spaced apart by a set distance 426a, and a plurality of catalysts 442 may be disposed on one or both surfaces 412, 414. Cartridge assembly 420 is inserted into a rectangular growth chamber 530 and oriented so that the precursor gas can flow parallel to surfaces 412, 414, in a direction f illustrated by the arrows (or can be in the opposite direction). The precursor gas will pass through the spacing between the plurality of parallel plates 424 and nanowires will grow from surfaces 412, 414 on which catalysts were disposed. The set distance 426 between the parallel plates 424 is preferably substantially uniform, to ensure an even gas flow between the support layers and uniform exposure of the catalysts and growing wires 440.

After the growth process, cartridge assembly 420 can be removed from growth camber 530, and nanowires 440 harvested.

In other embodiments, parallel mesh screens may be used instead of, or in addition to, parallel plates 424. In one embodiment, for example, a mesh screen can be provided in place of one or more of the plurality of parallel plates. FIGS. 6A, 6B, 7 and 8 illustrate exemplary mesh screens 624 provided as a support layers. Each screen 624 has opposing first and second surfaces 612, 814 with a plurality of apertures 608. A plurality of nanowire catalysts can be disposed on either or both surfaces 814 and 612, as well as in each aperture 608. As illustrated in the enlarged views of FIGS. 6A and 6B, nanowires 640 may grow on surface 612 of screen 624 (provided that catalysts are disposed thereon). Nanowires can also grow into an interior surface 606 of aperture 608. Further, nanowires can grow on opposing surface 814 (see FIG. 8) (provided that catalysts are provided thereon). Thus, the mesh screen offers an increased surface area for possible nanowire growth, including not only surfaces 612 and 814, but also interior surface 606 of each aperture 608.

Figure 7:
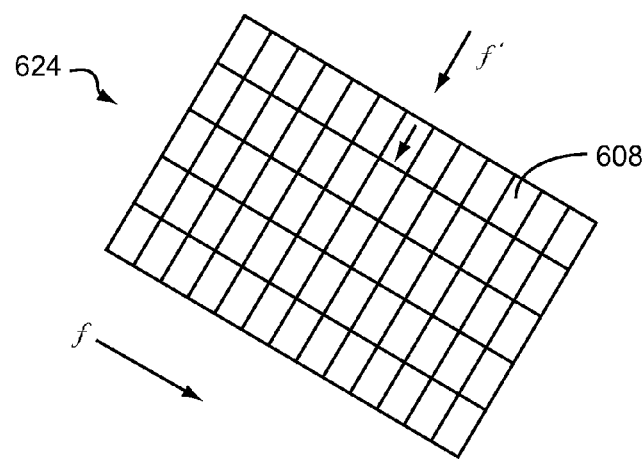
FIG. 7 is a schematic illustration of the mesh screen of FIG. 6A, illustrating embodiments of directions of precursor gas flow.
Figure 8:
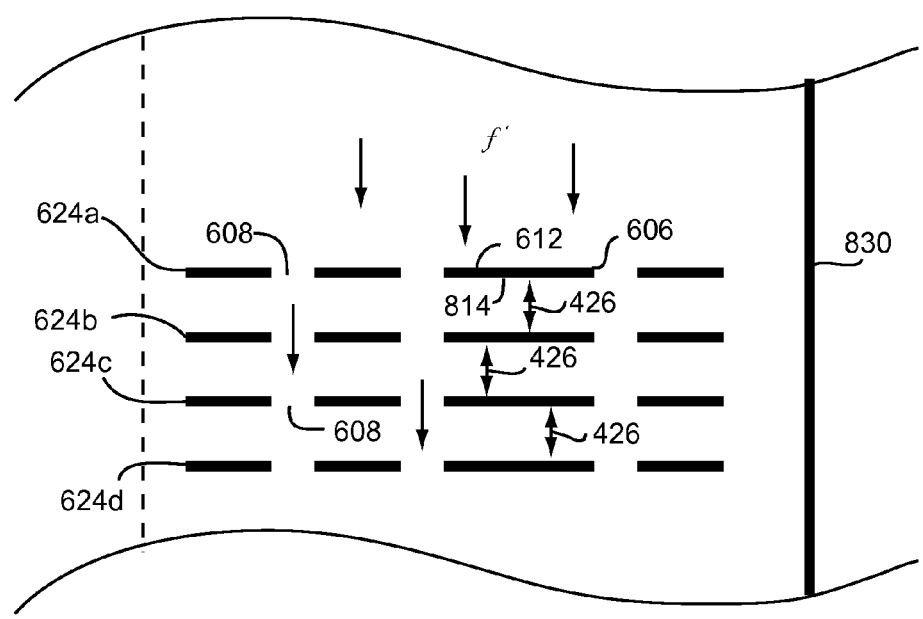
FIG. 8 is a schematic illustration showing a portion of a cartridge assembly in a nanowire growth chamber, in accordance with an embodiment of the present invention.

As shown in FIG. 7, a precursor gas may be provided in a flow direction f, so as to be parallel with the surface of each mesh screen 624. Alternatively, the precursor gas may be provided perpendicular to surfaces 612 and 814, in a flow direction f, as illustrated by its respective arrow in FIG. 7. In the latter example, the precursor gas flow is likely to be more turbulent than in the former example, as it will be disrupted by screen 624 and forced to flow through apertures 608. This latter example is shown in FIG. 8. A plurality of spaced-apart parallel mesh screens comprise a cartridge assembly that is placed in a nanowire growth chamber 830. Precursor gas flows in direction f, perpendicular to surfaces 612 and 814, through apertures 608.

Figure 9:
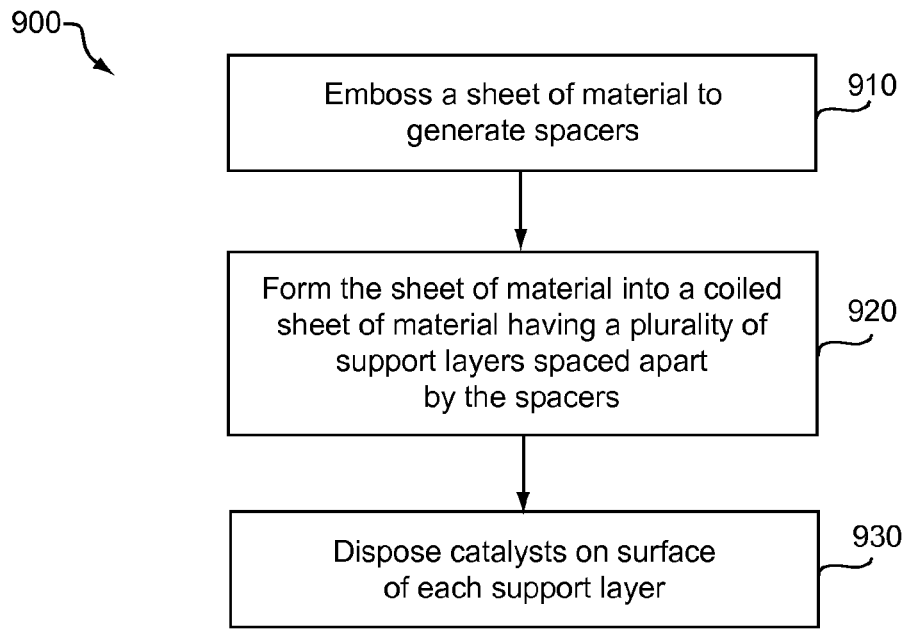
FIG. 9 is a flow chart depicting a method for making a nanowire growth cartridge assembly, in accordance with an embodiment of the present invention.
Figure 10:
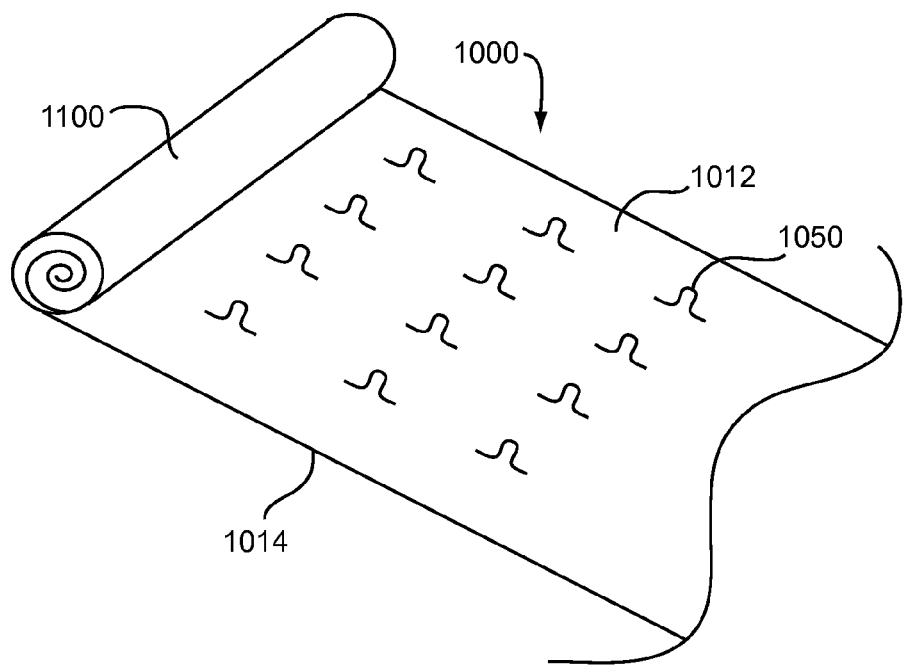
FIG. 10 is a schematic illustration showing a sheet of material with spacers, in accordance with an embodiment of the present invention.

A method for forming cartridge assembly 220 in accordance with one embodiment of the present invention is described with reference to FIGS. 9-11. FIG. 9 provides a flowchart of a method 900 for making a nanowire growth cartridge assembly 220. Method 900 includes steps 910, 920 and 930. In step 910, a sheet of material is embossed to generate spacers. In step 920, the sheet of material is formed into a coiled sheet of material having a plurality of support layers that are spaced apart by the spacers. In step 930, catalysts are disposed on one or both opposing surfaces of each support layer. Reference is made to FIG. 10 in which a coil of material 1100 is unwound to form an uncoiled sheet of material 1000 with opposing first and second surfaces 1012, 1014. Sheet of material 1000 is suitably placed through a stamping machine (not shown) to emboss surface 1014 to create a plurality of spaced protrusions, or nubs, which form spacers 1050, protruding from opposing surface 1012. Alternatively, the surface may be crimped to have a corrugated pattern or to have intermittent folds which can serve as spacers 1050.

As shown in the axial view of FIG. 11, sheet of material 1000 has been manipulated after embossing to form a coil so as to have the plurality of support layers 224 spaced apart by spacers 1050. The heights 1052 of each spacer 1050 is substantially the same as the set distance 226 that separates adjacent support layers 224, and ensures that support layers 224 are separated by set distance 226. In this manner, a sheet of material is easily formed to include spacers so that the sheet can be coiled to form support layers 224 that are guaranteed to be spaced apart by set distance. Spacing between support layers may range between 10-1000 lam in one embodiment, 20-500 µm in another embodiment, 20-100 µm in another embodiment, and 30-50 µm in another embodiment. For example, the spacing between adjacent support layers 224 may be about 50 µm, with corresponding spacers of about 50 µm, and in another example the spacing 224 may be about 30 µm, with corresponding spacers of about 30 µm. In one embodiment, spacers are provided on only a few percent of the surface area of sheet material 1000, for example from 2-10%, from 3-8%, from 2-5%, or from less than 1%.

In one embodiment, heights 1052 of each spacer 1050 may be substantially the same, thereby ensuring a uniform spacing between plurality of support layers 224 of cartridge assembly 220. In other embodiment, the heights 1052 vary. For example, the heights may vary along sheet of material 1000 in a configuration such that the spacing varies radially between adjacent support layers. For example, the outer layers of the coil may be closer together than the inner layers, or vice versa.

In one embodiment, the heights of spacers (e.g., protrusions 1056) may range from about one to about five times the length of the nanowires that are desired to be grown on the surface of the sheet of material 1000.

In lieu of or in addition to protrusions as spacers, mechanical spacers, spacing rods, or particles may be used as spacers 1050 to separate support layers by the set distance. Such other spacers may or may not be removed from the sheet of material after it is coiled into cartridge assembly 220.

In one embodiment, catalysts can be disposed onto surfaces 1012 and/or 1014 of sheet material 1000 prior to coiling the sheet. In another embodiment, sheet of material 1000 is coiled prior to disposing the catalysts. As noted above, several methods for disposing catalysts onto nanowire growth substrates may be used. For example, in one embodiment, aluminum foil may be used as sheet of material 1000. The foil is boiled for approximately 10 minutes, so as to convert the surface to aluminum trihydrate, and then the coil is dried and placed in a solution of gold colloid, which sticks to the surface. The aluminum coil is then dried off and the coil is tightened prior to being placed into the growth chamber (e.g., growth chamber 230). This process may also be made continuous, as a roll-to-roll process, in which sheet material 1000 is (i) unwound from coil 1100 (see FIG. 10), (ii) sent through an embossing machine to generate spacers 1050 integrally on surface 1012 of sheet 100, (iii) boiled, (iv) dried, then (v) gold colloid is disposed thereon, then (vi) dried and (vii) recoiled, to form cartridge assembly 220.

In another embodiments, catalysts may be disposed using polylysine as an adhesive layer, electrophoresis, or a gold film may be disposed on one or both surfaces 1012, 1014, and heat then applied that causes the colloid to coalesce and form droplets of catalysts.

In an embodiment in which a CVD furnace is used in conjunction with cartridge assembly 220, nanowires may grow over the course of a few hours. For example, one run using an 8 inch coil cartridge may produce 100-200 grams, whereby five runs produces about one kilogram of nanowires. For fuel cell catalysts, for example, a gram of nanowires is often needed. Thus, it should be apparent that bulk nanowire production is achieved by the apparatus and methods of the present invention.

To harvest the nanowires from a cartridge assembly comprised of a coiled sheet of material (e.g., cartridge 220), the coiled sheet may be unrolled prior to removal of the nanowires. Alternatively, the nanowires may be harvested directly from coiled sheet, with the sheet remaining coiled. Sonication or mechanical means, or any other means known to one of skill in the art may be used to harvest the nanowires. In a sonication process, the sheet of material with nanowires is immersed in a solution bath (e.g., a bath of isopropyl alcohol (IPA)) and subjected to ultrasonic waves from ultrasonic transducers, whereby the nanowires are detached from the sheet of material and are collected in the bath. A subsequent filtration step may then be employed to separate the nanowires from the solution (IPA). For example, the nanowires and IPA mixture may be filtered under pressure through a micron filter (e.g., 0.4 micron filter), with the nanowires being collected by the filter. The collected filter mat of nanowires may then be dried. An exemplary sonication method of harvesting the nanowires from the unrolled coiled sheet is described later with reference to FIG. 21.

Sheet of material 1000 is suitably as thin as possible to maximize the surface area available for a nanowire growth. For example, in one embodiment, a sheet of material may have a thickness in the range of less than about 1 mm, and in other embodiments, the sheet of material has a thickness of about 0.5 to about 1 mm, about 5 to about 50 µm, or about 10-20 µm. Sheet of material may be any suitable material including glass, polymers, ceramics or metals. Sheet of material 1000 is not required to be of crystalline structure, but should withstand a high temperature in a CVD furnace, as well as the temperature necessary for disposition of the catalysts. In further embodiments, sheet of material 1000 may also be a flexible mesh wire mesh material that may be rolled into a coil. In one embodiment, a stainless steel sheet is used that is 0.00127 cm thick and 10 cm wide. Such a sheet can be provided with 30 µm protrusion to make a cylindrical cartridge assembly having a 7.5 cm diameter and 10 centimeters in length, with the available surface area for nanowire growth approaching 10 m$^2$. In another embodiment, cartridge assembly 220 has a 7.62 cm diameter D and an 20.32 cm length L.

The present invention is scalable, such that increasing the size of the cartridge assembly should increase the total weight of nanowires that may be harvested therefrom. For example, an 20.32 cm diameter cartridge assembly 220 being about 0.3 m to 0.6 m in length may produce between 0.5 to 1 kilograms of nanowires in bulk. Since the weight of the cartridge assembly increases with its size, size of cartridge assembly 220 may be optimized for ease of handling. For example, it may be decided that it is more desirable to have multiple smaller tubes in a large growth chamber 230, rather than one large tube. Further, there may be production issues that arise as the cartridge increases in size, such as, for example, heat uniformity issues.

Figure 13:
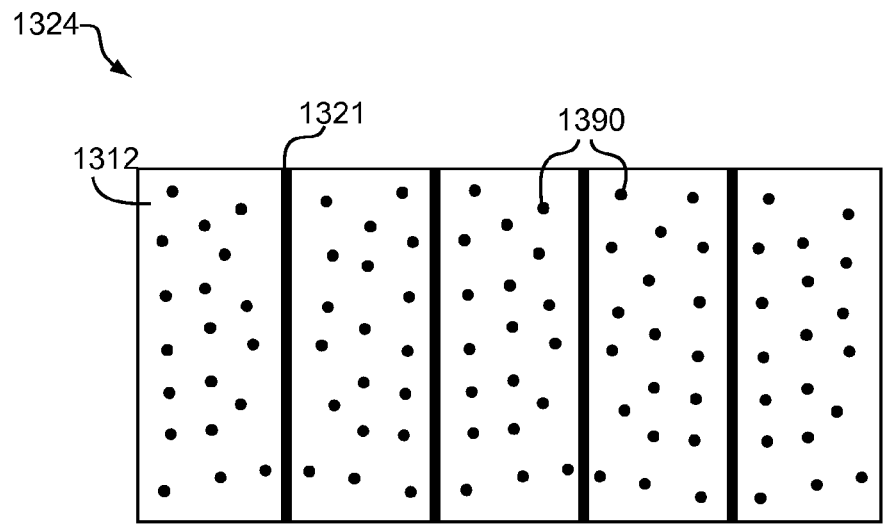
FIG. 13 is a schematic illustration of a support layer surface having catalysts disposed thereon in a pattern.

In any of the aforementioned embodiments, catalysts may be disposed on one or both opposing surfaces of each support layer of the cartridge assembly. The density of disposed catalysts may be selected as desired, such as, for example, 1 to 100 particles/cm$^2$. In other embodiments, the density can be, for example, 1 to 500 particles/cm$^2$, or 100 to 500 particles/cm$^2$. Further, the catalysts can be disposed uniformly on each surface or may be disposed in a pattern. FIG. 13 illustrates an example of a patterned disposition of catalysts 1390 on a surface 1312 of an exemplary support layer 1324. Support layer 1324 may be one of the plurality of support layers 424 of cartridge assembly 420 with parallel plates (see FIG. 4), or may be a portion of a sheet of material that is coiled to make cartridge assembly 220, for example. A masking 1321 is suitably provided on surface 1312 of support layer 1324 in the region where nanowire growth is not desired prior to disposing the catalyst on the surface. Masking 1321 may be any film or other material layer to which catalysts 1390 will not adhere to, such that catalysts 1390 are disposed only the surface of 1324 in the regions where masking 1321 is absent.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

Figure 14:
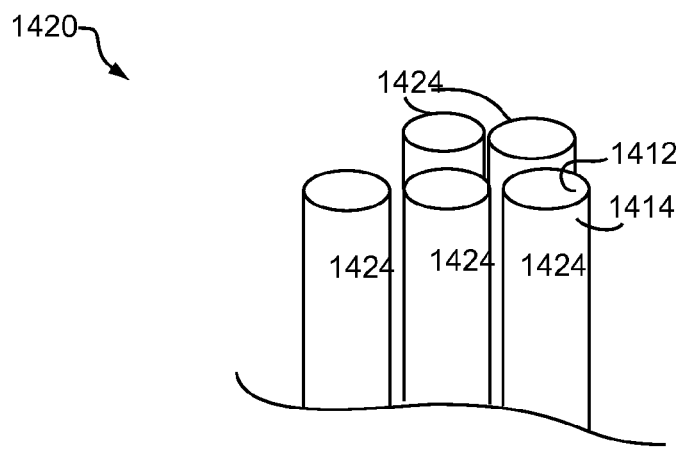
FIG. 14 is a schematic illustration of an additional cartridge assembly, in accordance with an embodiment of the present invention.
Figure 15:
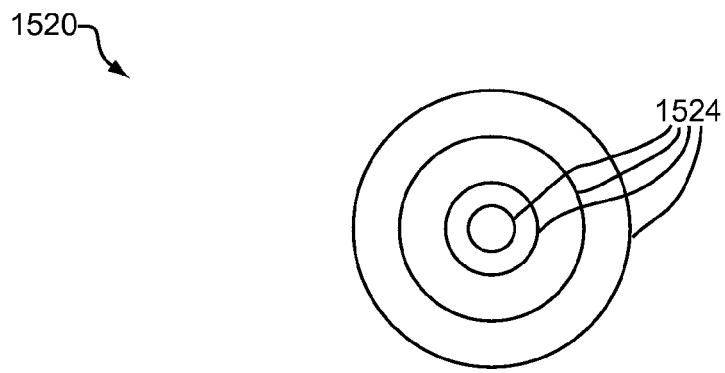
FIG. 15 is a schematic illustration of an additional cartridge assembly, in accordance with an embodiment of the present invention.
Figure 16:
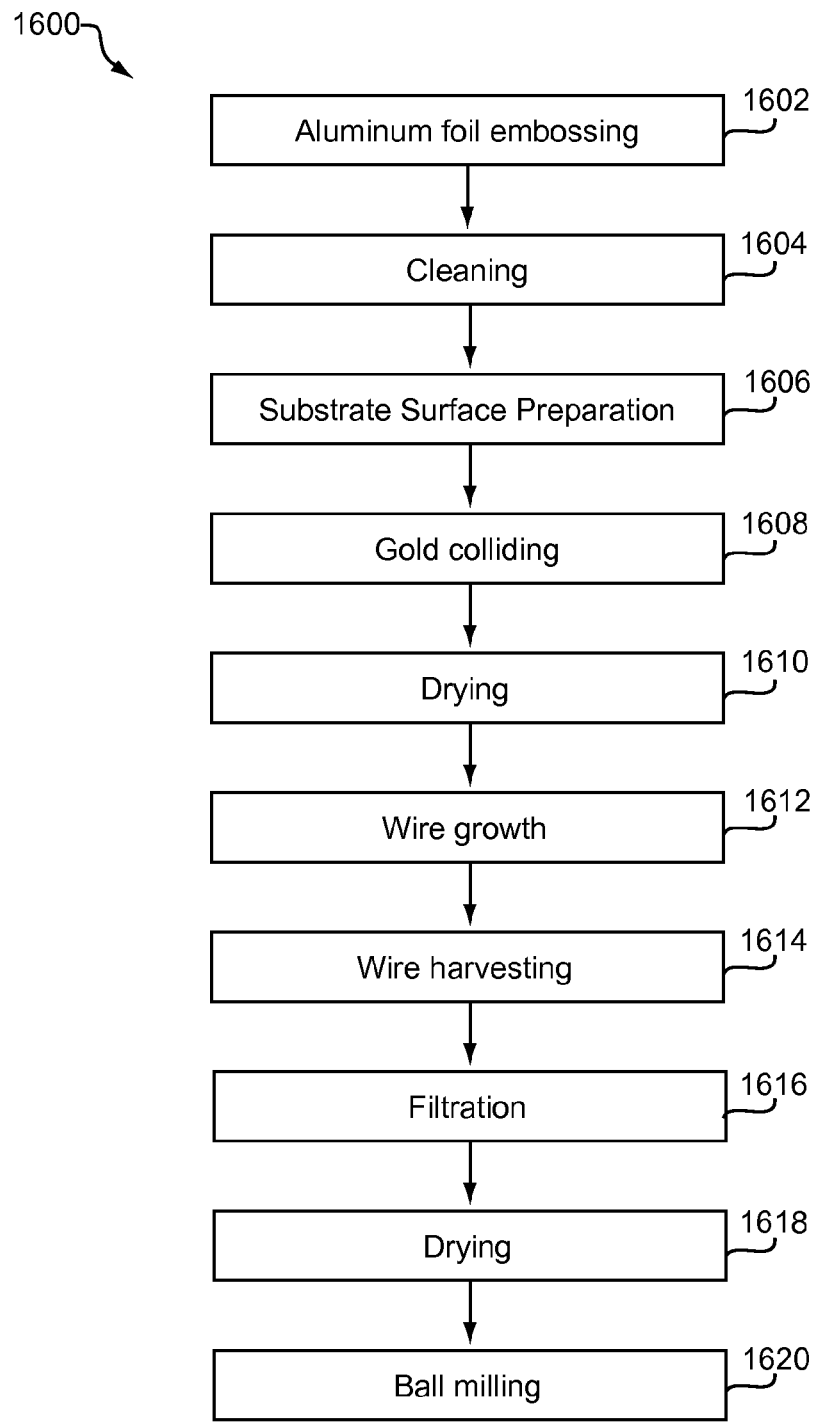
FIG. 16 shows an exemplary process for producing nanowires in accordance with an embodiment of the present invention.

For example, as shown in FIG. 14, a cartridge assembly 1420 in accordance with the present invention can be comprised of a plurality of parallel tubes 1424. Each tube 1424 has an inner surface 1412 and an outer surface 1414 on which catalysts may be disposed. This cartridge of tubes 1424 may be placed in a nanowire growth chamber, and the precursor gas may be provided in a flow direction that is perpendicular to the longitudinal axes of tubes 1424, or in a flow direction that is parallel with the longitudinal axes of tubes 1424. For example, as shown in the axial view of FIG. 15, a cartridge assembly 1520 according to another embodiment of the present invention can be comprised of a plurality of concentric tubes 1524, each surface of each tube 1524 serving as a support layer for nanowire growth. By using the cartridge assemblies of the present invention as nanowire growth supports, an efficient use of the precursor gas can be achieved and nanowire growth can be maximized for the available surface area and growth chamber volume. Further, for a given cartridge assembly and nanowire growth chamber, gas flow, gas concentration temperature, and gas flow directions may be optimized to ensure uniform exposure of the catalysts and growing nanowires, and efficient use of the precursor gas.

EXAMPLES

Example 1

Exemplary Manufacturing Process

An exemplary manufacturing process utilizing a high volume, high density method of growing nanowires will now be described with reference to FIGS. 16-22. As set forth in FIG. 16, flowchart 1600 provides exemplary production methods for nanowire manufacturing. The methods of flowchart 1600 suitably comprise step 1602, in which an aluminum foil is embossed. In step 1604 of flowchart 1600, the foil is then cleaned, and in step 1606a substrate surface is prepared (e.g., a metal, polymer, carbon or other substrate). Gold colloid is disposed on the substrate in step 1608, followed by drying in step 1610. Nanowire growth is then performed in step 1612 using a VLS-process (other processes as described herein can also be used). The nanowires are then harvested (for example, by sonication) in step 1614, filtered in step 1616 and dried in step 1618. The nanowires can then be ball milled in step 1620 to break the nanowires into short segments, which may be used, for example, as additives in a battery slurry as described in U.S. Provisional Patent Application No. 61/221,392, filed Jun. 29, 2009, entitled, "Nanostructured Materials for Battery Applications," the disclosure of which is incorporated by reference herein.

Figure 17:
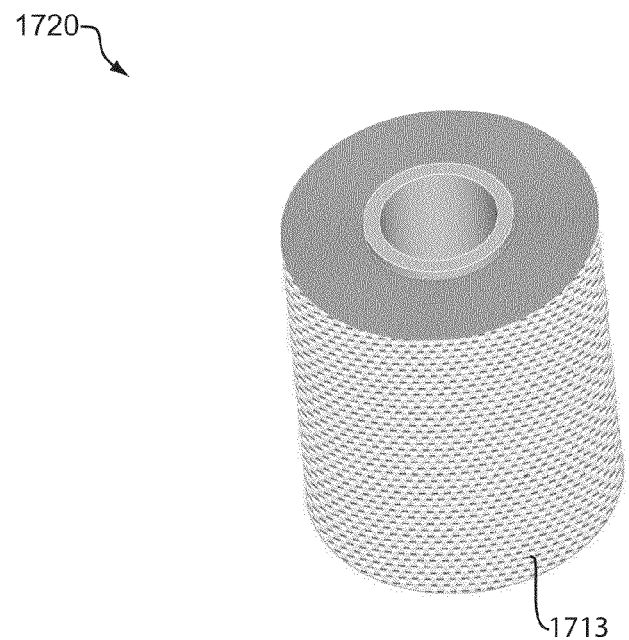
FIG. 17 illustrates an exemplary cartridge assembly, in accordance with an embodiment of the present invention.
Figure 18:
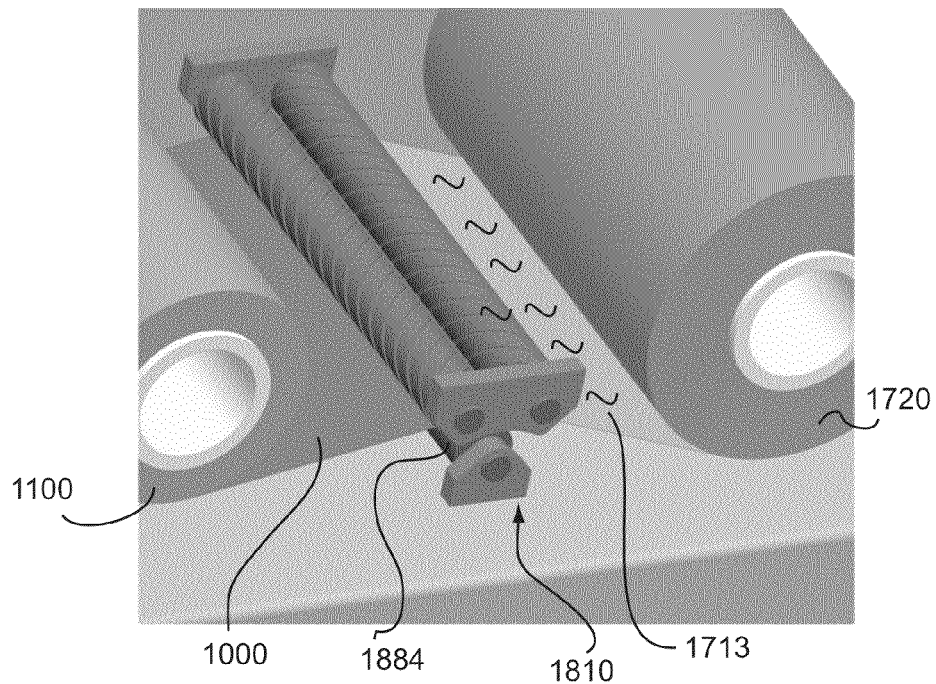
FIG. 18 is a schematic illustration of an exemplary embossing apparatus used in making a cartridge assembly, in accordance with an embodiment of the present invention.
Figure 19:
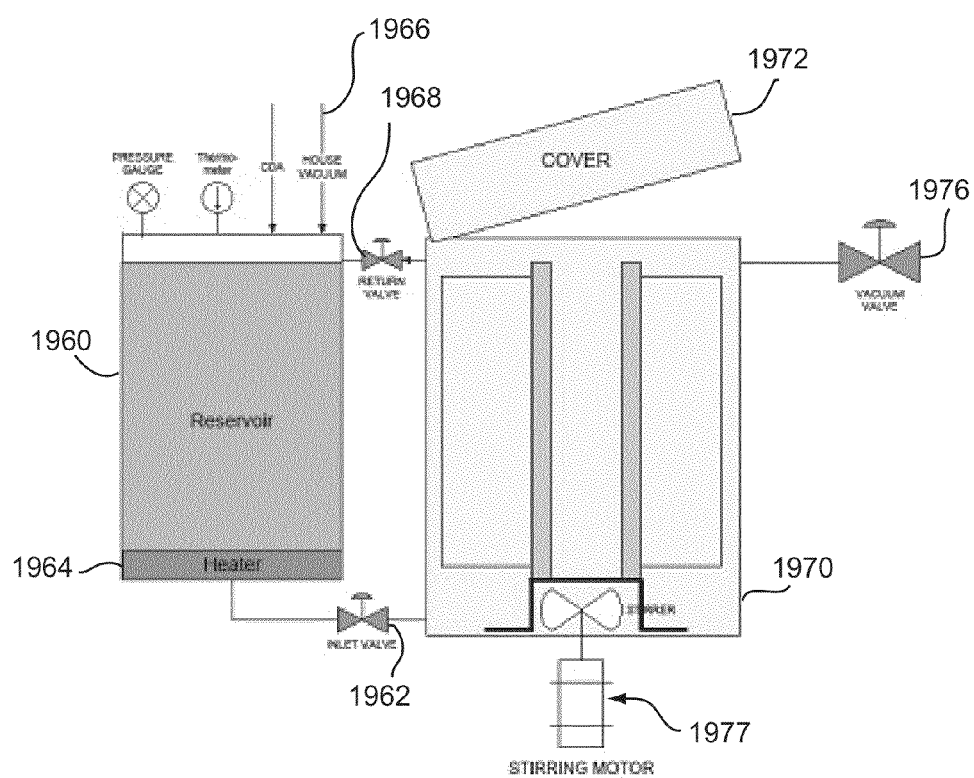
FIG. 19 is a schematic illustration of an exemplary apparatus for treating surfaces of a cartridge assembly prior to disposing catalysts thereon, in accordance with an embodiment of the present invention.

As shown in FIG. 17, the embossed aluminum foil having an embossed profile 1713 on its surface can be formed into a coil that serves as a cartridge assembly 1720 to facilitate preparation of a large number of nanowires, in accordance with the present invention. FIG. 18 shows an embossing apparatus 1880 which may be used for step 1602 to emboss the aluminum foil. Specifically, a coil of aluminum foil 1100 is unwound to form an uncoiled sheet of foil 1000 that is suitably placed through embossing apparatus 1880 to provide embossed profile 1713 on the foil's surface. Embossing apparatus 1880 includes a left-handed helical die roll 1881, a right-handed helical die roll 1882, and a nip roll 1884. Foil 1000 is sandwiched between the rolls, with the die rolls 1881, 1882 disposed against a first surface of foil 1000 and nip roll 1884 disposed against the opposing second surface of foil 1000. A suitable pressure is applied by rolls 1881, 1882, and 1884 against the surfaces of foil 1000 such that foil 1000 is embossed to have embossed profile 1713. Foil 1000 is rewound after embossing to form cartridge assembly 1720. Embossed profile 1713 serves as spacers that maintain a substantially uniform space between layers of the coiled foil that form cartridge assembly 1720.

Cleaning of the foil in step 1604 may be achieved by immersing the foil in a standard chemical immersion apparatus. For example, after cartridge assembly 1720 is formed after embossing, the foil may immersed in a bath of IPA. Thereafter, in step 1606, the surfaces of cartridge assembly 1720 may be prepared for disposing gold colloid thereon in step 1608. Surface preparation of cartridge assembly 1720 may be achieved by subjecting cartridge assembly 1720 to a hot water treatment process using the apparatus illustrated in FIG. 19. Hot water may be used to convert the cartridge's surfaces from metallic aluminum to hydroxylated or hydrated alumina, to which the gold colloid is attracted. The water treatment apparatus of FIG. 19 includes a reservoir 1960 provided with a heater 1964 and a vacuum 1966, and a surface preparation tank 1970 in fluid communication with reservoir 1960 via an inlet valve 1962 and a return valve 1968. Surface preparation tank 1970 is provided with a cover 1972, a vacuum valve 1976, and a stirrer 1977 for circulating hot water in the tank. In operation, cartridge assembly 1720 is placed in surface preparation tank 1970 and cover 1972 is closed. Vacuum 1966 is then operated to eliminated air bubbles in the water contained in reservoir 1960, and vacuum valve 1976 is operated to eliminate air bubbles trapped between foil layers in cartridge assembly 1720. Both inlet valve 1962 and outlet valve 1968 are then opened, and the water, heated by heater 1964, is circulated through surface preparation tank 1970, entering surface preparation tank 1970 via inlet valve 1962, and exiting via return valve 1968.

Figure 20:
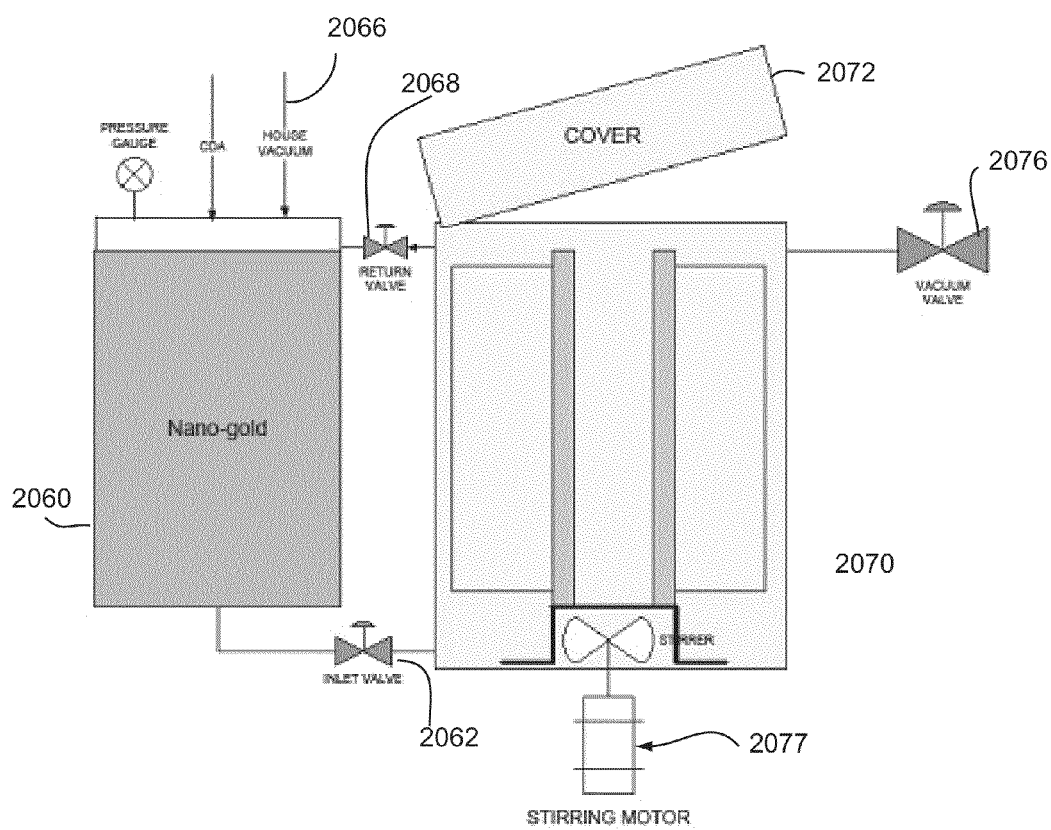
FIG. 20 is a schematic illustration of an exemplary apparatus for disposing catalysts on surfaces of a cartridge assembly, in accordance with an embodiment of the present invention.

Disposing gold colloid (step 1608) on cartridge assembly 1720 may be achieved using the apparatus illustrated in FIG. 20. This apparatus includes a reservoir 2060 provided with a vacuum 2066, and a disposition tank 2070 in fluid communication with reservoir 2060 via an inlet valve 2062 and a return valve 2068. Disposition tank 2070 is provided with a cover 2072, a vacuum valve 2076, and a stirrer 2077 for circulating gold colloid in the tank. In operation, cartridge assembly 1720 which has been surface-treated in step 1606 is disposed in tank 2070 and cover 2072 is closed. Vacuum 2066 is then operated to eliminated air bubbles in the gold colloid contained in reservoir 2060, and vacuum valve 2076 is operated to eliminate any air bubbles trapped between foil layers in cartridge assembly 1720. Both inlet valve 2062 and outlet valve 2068 are then opened, and the gold colloid is circulated through disposition tank 2070, entering the tank via inlet valve 2062, and exiting via return valve 2068.

After gold colloid is disposed on cartridge assembly 1720, and before growing the nanowires, cartridge assembly 1720 is dried (step 1610). Drying may be achieved by loading the cartridge assembly in a nanowire growth chamber, and flushing the chamber with high velocity hot air. Hot air may be used in combination with other heaters (such as a heating coil which heats the cartridge assembly in the chamber).

Thereafter, a precursor gas is applied to the chamber to grow nanowires on the surfaces of each layer of cartridge assembly 1720 (step 1612). Following the growth process, the chamber may be purged of the precursor gas and cartridge assembly 1720 cooled. These processes of drying, wire growth, and cooling may take place in a single chamber, or the coil may be moved to separate chambers, or moved to separate sections of the same chamber, wherein each section is maintained at its respective process temperature. The movement of the cartridge assembly between the separate chambers/sections may be automated.

Figure 21:
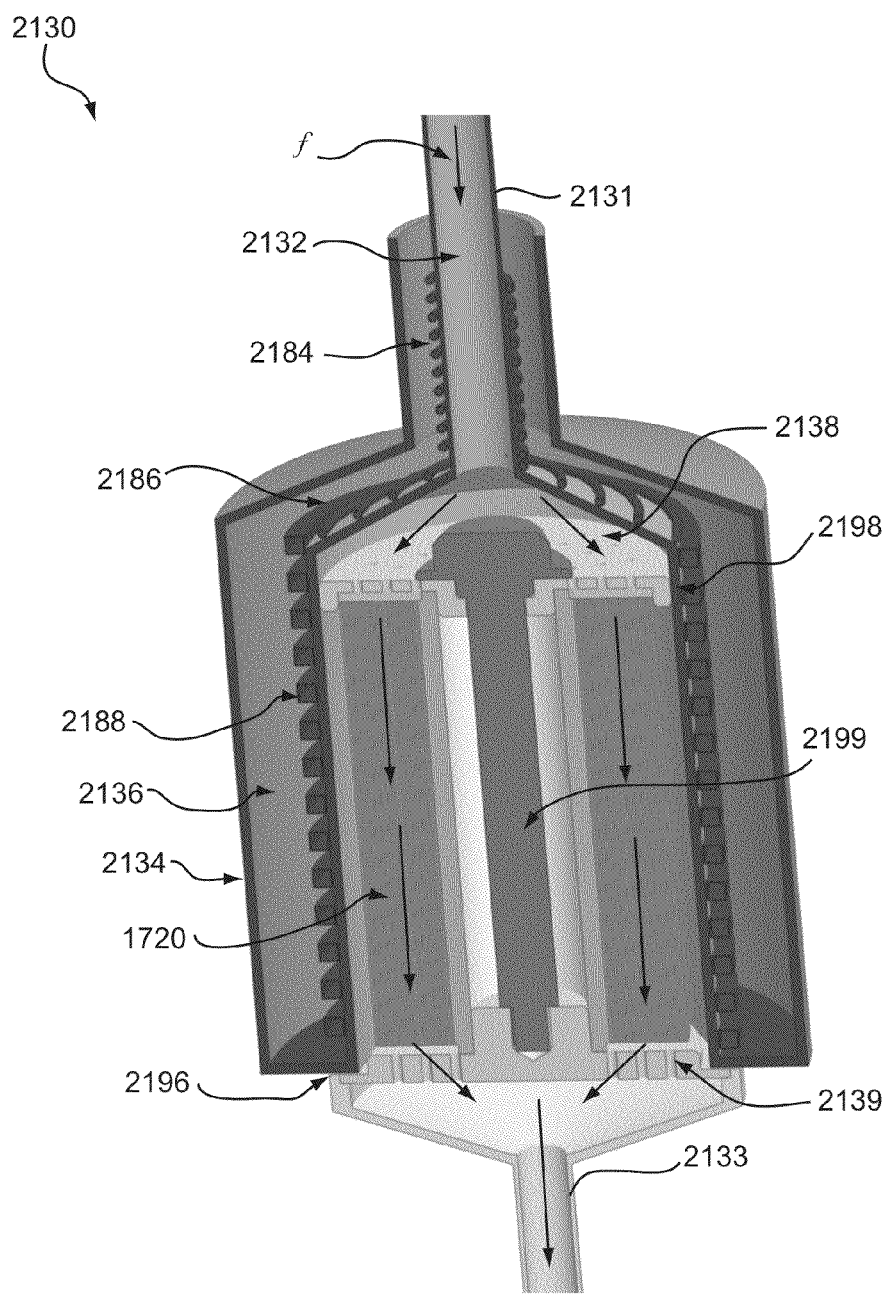
FIG. 21 is a schematic illustration showing a cartridge assembly in a nanowire growth chamber, in accordance with an embodiment of the present invention.

FIG. 21 illustrates a schematic (shown in cross-section) of cartridge assembly 1720 loaded in an exemplary nanowire growth chamber 2130 for growing nanowires (step 1612). Chamber 2130 may also be used for the pre-growth process of drying and the post-growth process of cooling. Chamber 2130 includes an outer enclosure 2134 within which is disposed insulation 2136, a gas heater coil 2184, a blanket heater coil 2186, and a process heater coil 2188 (each of which may be cooling coils if the chamber is intended for use in post-growth process cooling). Cartridge assembly 1720 is loaded at loading platform 2139 at the bottom of chamber 2130, and a housing 2138 covers a top of cartridge assembly 1720 in chamber 2130. A holding bolt 2199 holds cartridge assembly 1720 sandwiched between loading platform 2139 and top housing 2138. A piston seal 2198 separates the heater coils from cartridge assembly 1720, and a seal gasket 2196 provides a seal were loading platform 2139 connects to enclosure 2134. Loading platform 2139, top housing 2138, and piston seal 2198 define an inner chamber in which cartridge assembly 1720 is disposed and through which gas flows. Blanket heater coil 2186 surrounds a top of cartridge assembly 1720 and process heater coil 2188 surrounds sides of cartridge assembly 1720. Gas enters chamber 2130 through gas line 2132 at an inlet 2131, is heated by gas heater coil 2184 surrounding gas line 2132, flows through the spacing between foil layers of cartridge assembly 1720, and exits at an exhaust 2133 at the bottom of chamber 2130. The gas flow direction f through the chamber 2130 is illustrated by the arrows in FIG. 21. As shown, the gas flow direction is parallel with a longitudinal axis of cartridge assembly 1720. For growing nanowires, the gas used is a suitable precursor gas, whereby nanowires grow from gold colloid catalysts disposed on the layers of cartridge assembly 1720. If chamber 2130 is used for the pre-growth process of drying (step 1610) or the post-growth process of cooling, then the gas used may be air, for example.

Figure 22:
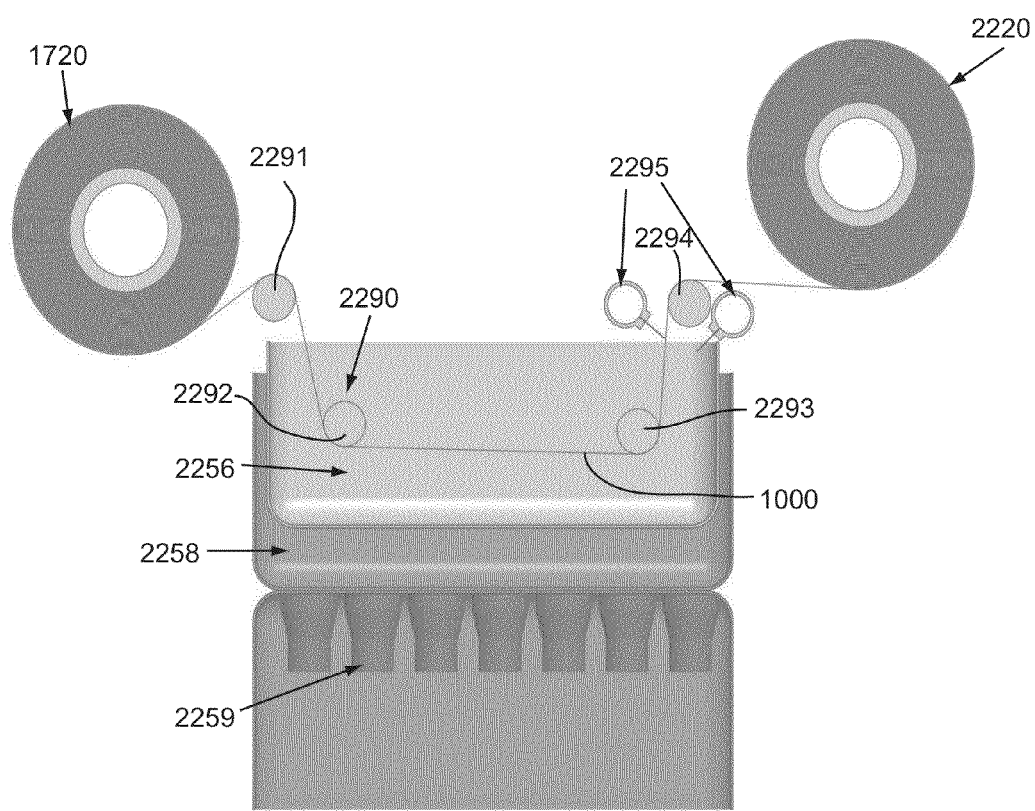
FIG. 22 is a schematic illustration of an exemplary apparatus for harvesting nanowires from a cartridge assembly, in accordance with an embodiment of the present invention.

FIG. 22 illustrates a schematic of an exemplary apparatus for harvesting nanowires from cartridge assembly 1720 (step 1614) using a sonication process. The harvesting apparatus includes a harvesting tank 2256 filled with a solvent such as IPA. Tank 2256 is placed in an outer tank 2258 filled with distilled $H_2O$ (DI-$H_2O$). At the bottom of outer tank 2258 are one or more ultrasonic transducers 2259. The tank within another tank is used for improving the safety of the sonication process, but is not necessary. After the growth process (step 1614), cartridge assembly 1720 is unwound such that sheet of material 1000 with nanowires thereon (not shown) is passed through harvesting tank 2256 via multiple rollers 2291, 2292, 2293, and 2294. Rollers 2292 and 2293 reside within harvesting tank 2256 and serve to keep material 1000 immersed in the IPA while being subjected to the ultrasonic waves from transducers 2259. Flat spray manifolds 2295 are provided to spray the opposing surfaces of material 1000 as it exits harvesting tank 2256, so as to remove nanowires still connected to the of surface material 1000 after sonication. After roller 2294, material 1000 is rewound into a coil 2220 which can be cleaned and reused as a cartridge assembly, or can be recycled.

Example 2

Nanowire Growth Trials

Nanowire growth trials were conducted using a process in accordance with the present invention. The process included 12 process stages, which include Aluminum foil substrate mechanical pre-patterning (stage 1); Pre-cleaning in IPA (stage 2); Hot distilled $H_2O$ (DI-$H_2O$) hydroxylation/oxidation treatment (stage 3); Triple DI-$H_2O$ rinsing (stage 4); Gold nanoparticle disposition (stage 5); Triple DI-$H_2O$ rinsing (stage 6); IPA rinsing (stage 7); Oven drying (stage 8); CVD nanowire growth (stage 9); Wire harvesting (stage 10); Filtration (stage 11); and Drying (stage 12). Further details on the process stages is provided below. A summary of the trial data for Trial runs 202-051 and 202-057 is presented in Table 1.

TABLE 1

| | Run# 202- | |
|---|---|---|
| | -051 | -057 |
| 1100-H19 Al foils length (6" & 8"): | ~11.1 ft | ~9.6 ft |
| Au Colloid size (nm) | 60 | 20 |
| Au Colloid Deposit Time (hrs in diluted 0.01% Au Chloride)** | 5.0 | 4.5 |
| Au NP density (per µm2) | 10.6 | 21.2 |
| Tube OD (in) | 3 | 3 |
| Surface area (m2): | 2.42 | 2.07 |
| NW Growth conditions: | | |
| Total Pressure (torr): | 30 | 45 |
| Silane Partial Pressure (torr): | 1.7 | 4.8 |
| Silane Flow (sccm) | 50.2 | 75.2 |
| Hydrogen Flow (sccm) | 301 | 234 |
| Helium Flow (sccm) | 551 | 401 |
| TC Setpoint (° C.) | 455 | 450 |
| Total Gas Flow (sccm) | 902 | 711 |
| Calc. Gas Residence Time (sec)*** | 0.77 | 1.48 |
| Growth Time (min) | 60 | 100 |

TABLE 1-continued

| | Run# 202- | |
|---|---|---|
| | -051 | -057 |
| NW + Si Deposit wt gain (g): | 2.52 | 1.98 |
| (g/m2) | 1.04 | 0.96 |

**Dilutions are 60% for 60 nm and 30% for 20 nm.
***neglecting cross-sectional area occupied by the foils Process Stage 1: Aluminum Foil Substrate Pre-Patterning This stage involved producing sheets of aluminum (Al) with integral spacers which creates the necessary space between adjacent layers of sheet when coiled to ensure both liquid disposition of Au nanoparticles (from an Au colloid solution) and subsequent growth of Si NWs (from silane gas decomposition in a CVD furnace). For each trial, one Al sheet was 8 inches (20.32 cm) wide, 2.0 mil thick, 1100 alloy hard-tempered "H19" (1100-H19 from AllFoils, Inc.) and was deformed while passing through stainless steel rollers to produce a corrugation pattern with amplitude of about 0.9 mm. A second Al sheet that was 6 inches (15.24 cm) wide was embossed with dots. The second Al sheet was placed on the first AL sheet, and the sheets were rolled together to form a single coil.

Process Stage 2: Cleaning

In stage 2, the coil is pre-cleaned in IPA, by placing the coil vertically in a bath of IPA and subjecting the bath to 170 KHz sonication.

Process Stages 3 and 4: Substrate Surface Preparation

In stage 3, the coiled is subjected to a hot hydroxylation/oxidation treatment. The coil is placed in a bath of distilled $H_2O$ (DI-$H_2O$) at 60° C. whereby the Al substrate surfaces are chemically converted from metallic aluminum to hydroxylated or hydrated alumina to ensure they are positively charged. Subsequently, in stage 4, the coil is triple rinsed with DI-$H_2O$.

Process Stages 5-8: Gold Nanoparticle Disposition, Rinsing, and Drying

Figure 25A:
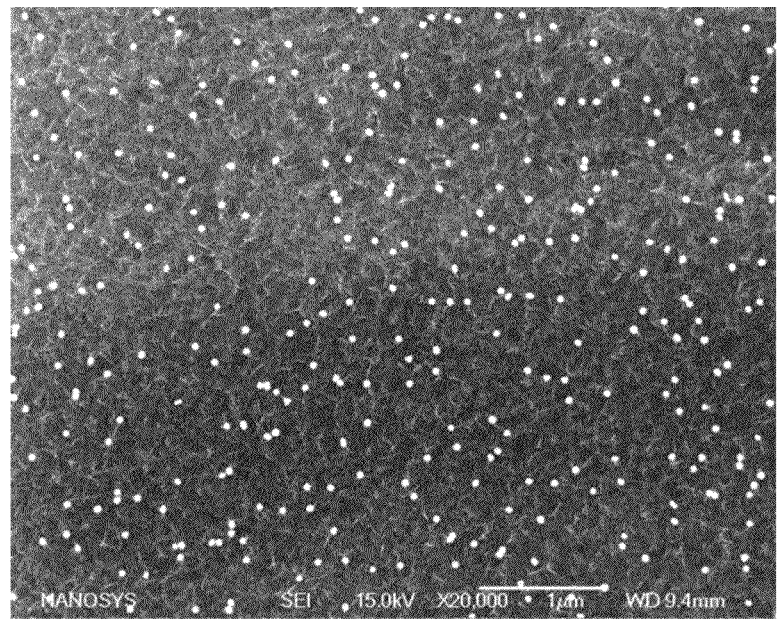
FIGS. 25A-25B show scanning electron microscopy (SEM) micrographs of 60 nm gold nanoparticles disposed on a boehmite alumina substrate surface, at low magnification (FIG. 25A) and high magnification (FIG. 25B).
Figure 25B:
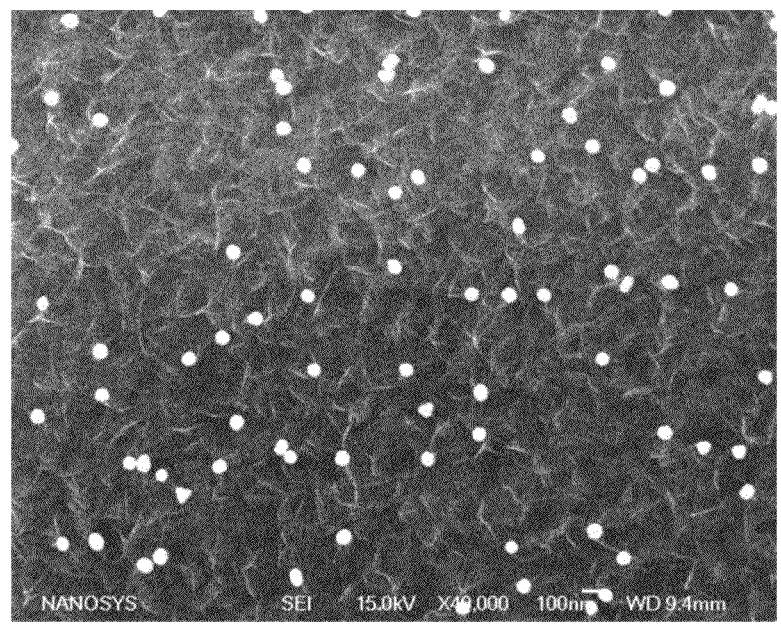
Figure 27A:
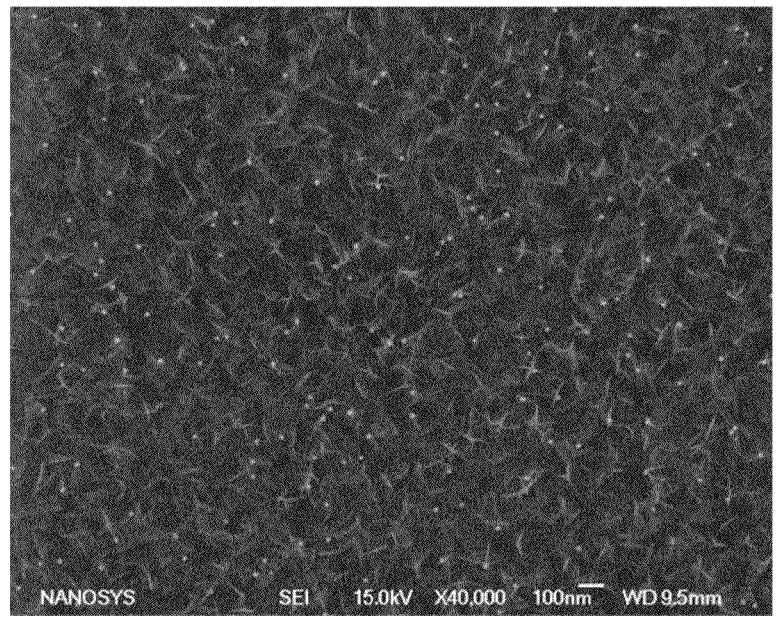
FIGS. 27A-27B show SEM micrographs of 20 nm gold nanoparticles disposed on a boehmite alumina substrate surface, at low magnification (FIG. 27A) and high magnification (FIG. 27B).
Figure 27B:
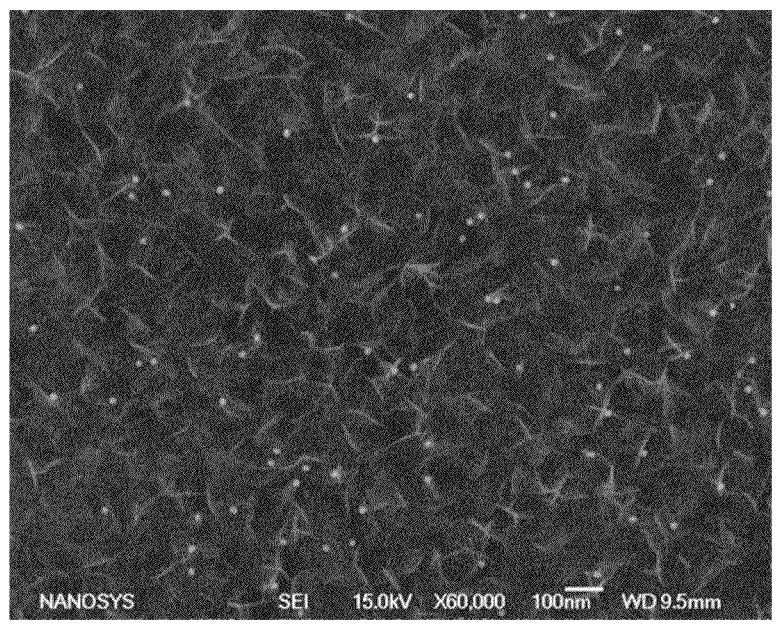
Figure 28A:
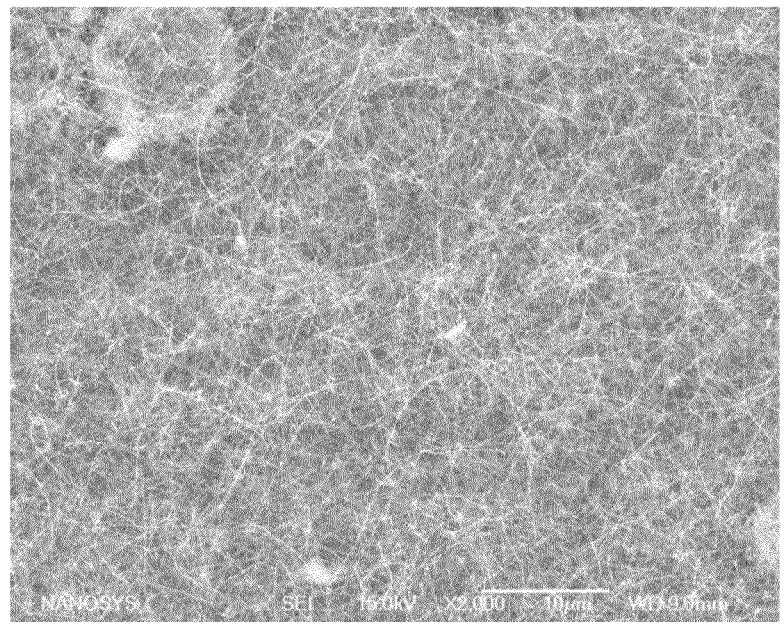
FIGS. 28A-28D show SEM micrographs of 60 nm nanowires grown on an alumina substrate surface, at low magnification (FIGS. 28A and 28B) and high magnification (FIGS. 28C and 28D).
Figure 28B:
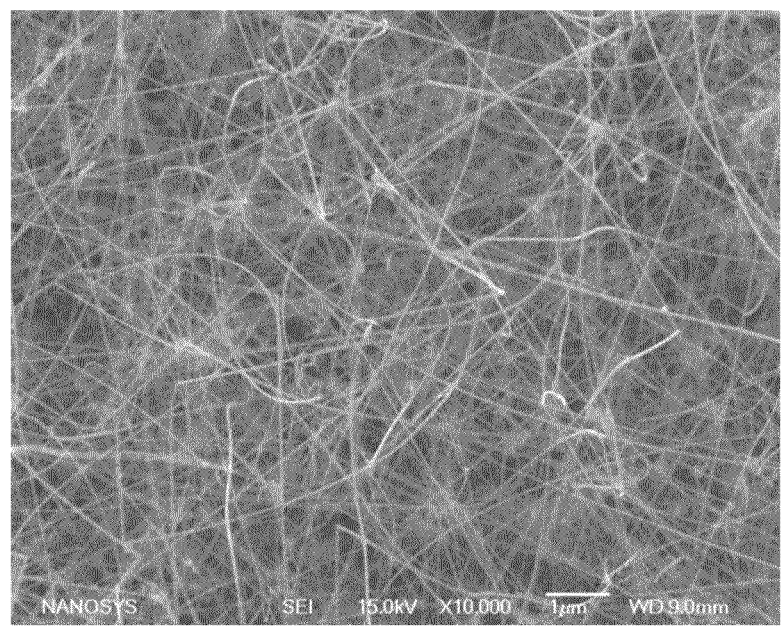
Figure 28C:
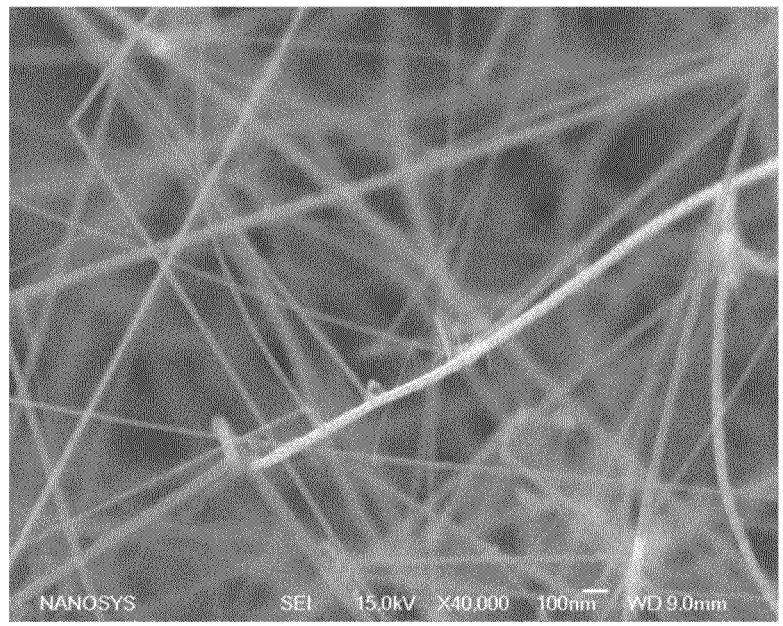
Figure 28D:
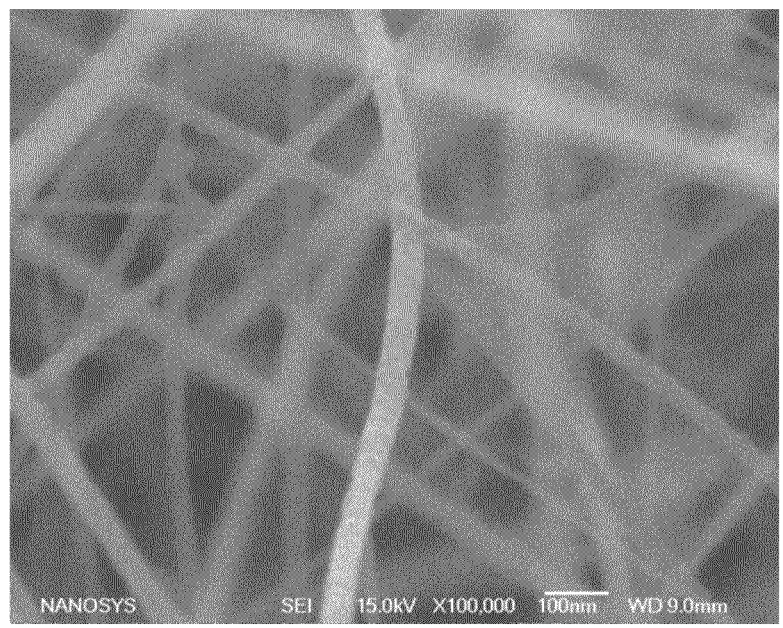

In stage 5, gold catalyst nanoparticles are disposed on the surfaces of the coil by soaking the coil in an aqueous suspensions of 0.01% Au chloride in DI-$H_2O$. The negatively charged Au catalyst particles ($HAuCl_4$) in the colloid are electrostaticly attracted to the positively charged alumina coil surfaces and substantially uniformly deposit on the surfaces. The colloidal solutions may range between 10%-70% Au Colloid (0.01% Au Chloride) in DI-$H_2O$. In Trial run 202-051, 60 nm size gold particles were disposed, and in Trial run 202-057, 20 nm size gold particles were disposed on the surfaces. FIGS. 25A and 25B show SEM micrographs of 60 nm Au nanoparticles on the alumina coil surface from Trial run 202-051. FIGS. 27A and 27B show SEM micrographs of 20 nm Au nanoparticles on the alumina coil surface from Trial run 202-057.

For Trial run 202-051, a colloidal aqueous suspension (0.01% Au Chloride, Optical Density OD=1) available commercially from BB International (British Biocell) was diluted to a solution of 60% Au Colloid (0.01% Au Chloride) in DI-$H_2O$. For Trial run 202-057, a colloidal aqueous suspension (0.01% Au Chloride) available commercially from BB International (British Biocell) was diluted to a solution of 30% Au Colloid (0.01% Au Chloride) in DI-$H_2O$.

In stage 6, the coil was tripled rinsed in DI-$H_2O$, and in stage 7, the coil was rinsed in IPA. In stage 8, the coil was oven dried at 110° C.

Process Stage 9: Nanowire Growth

Figure 23:
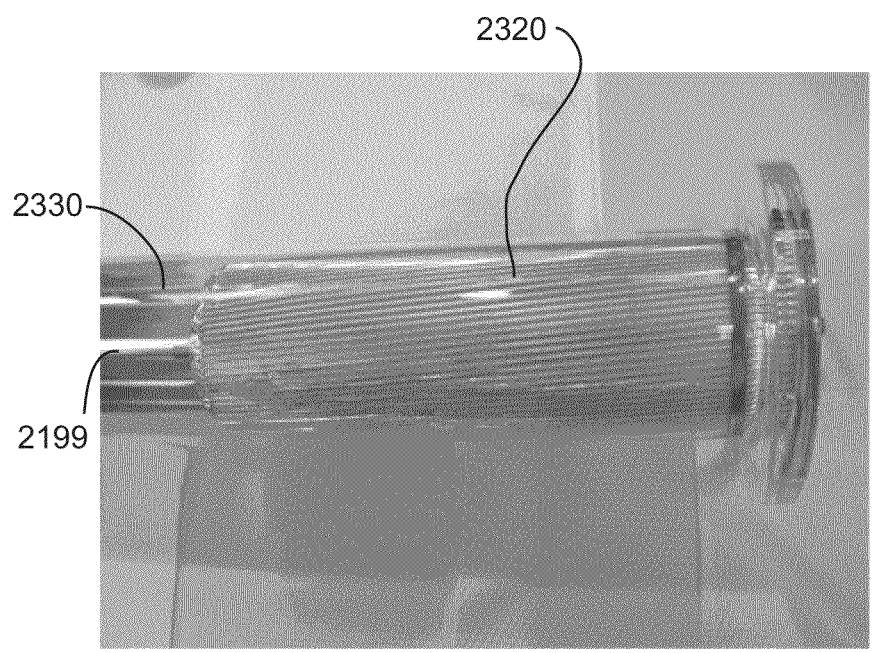
FIG. 23 is a side view of an exemplary cartridge assembly in a nanowire growth chamber, in accordance with an embodiment of the present invention.
Figure 24:
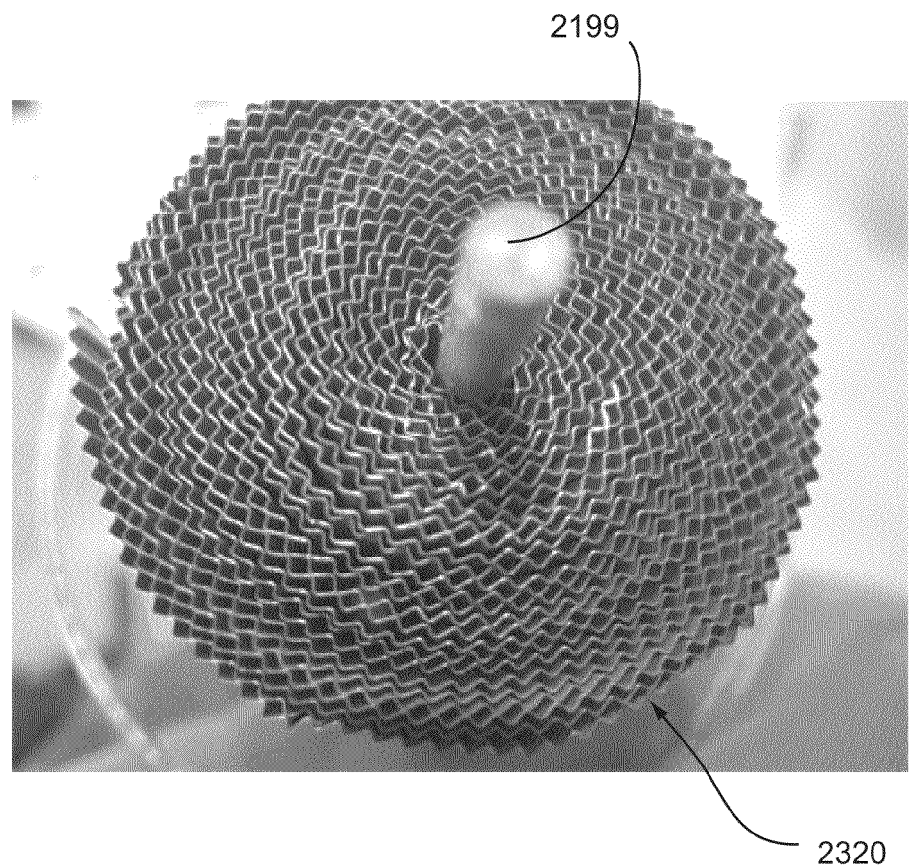
FIG. 24 is an axial view of the cartridge assembly of FIG. 23.

In stage 9, the dried coil is tightened and inserted into a 3 inch outer diameter (OD) CVD furnace tube (i.e., FIRST NANO EASYTUBE™ 2000 CVD furnace system from CVD Equipment Corporation, Ronkonkoma, N.Y.). FIG. 23 illustrates an Au-nanoparticle treated corrugated coil 2320 being bottom-loaded into a furnace tube 2330, in accordance with the present Example. Holding bolt 2199 (see also FIG. 21) extends along the center axis of the coil 2320. A foil piece (not shown) may be placed above holding bolt 2199 and used as a spacer to center the coil at the hot zone center (not shown) of the elongated furnace tube 2330. FIG. 24 illustrates an axial view of coil 2320 with holding bolt 2199.

At a low pressure in the furnace, silane gas ($SiH_4$) at a temperature of about 450° C. is passed over the coil's surfaces, whereby nanowires grow on the coil's surfaces. The gold nanoparticles act as catalytic sites or seeds for the thermal, gas-phase CVD growth of crystalline silicon wires of the same diameter. Catalyst diameter determines nanowire diameter, and wire length is controlled by exposure time to the silane gas. Typically, nanowire growth rate is about 0.7 µm/min.

Figure 26A:
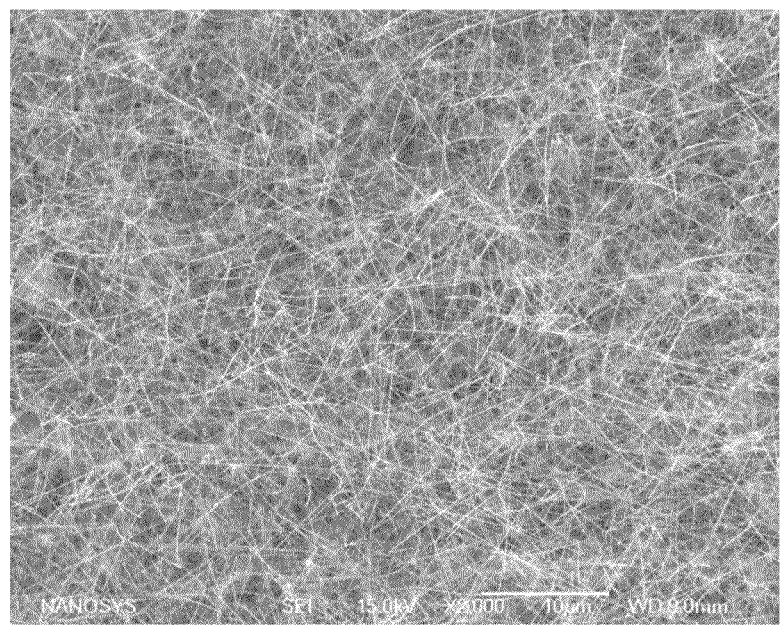
FIGS. 26A-26C show SEM micrographs of 60 nm nanowires grown on an alumina substrate surface, at low magnification (FIGS. 26A and 26B) and high magnification (FIG. 26C).
Figure 26B:
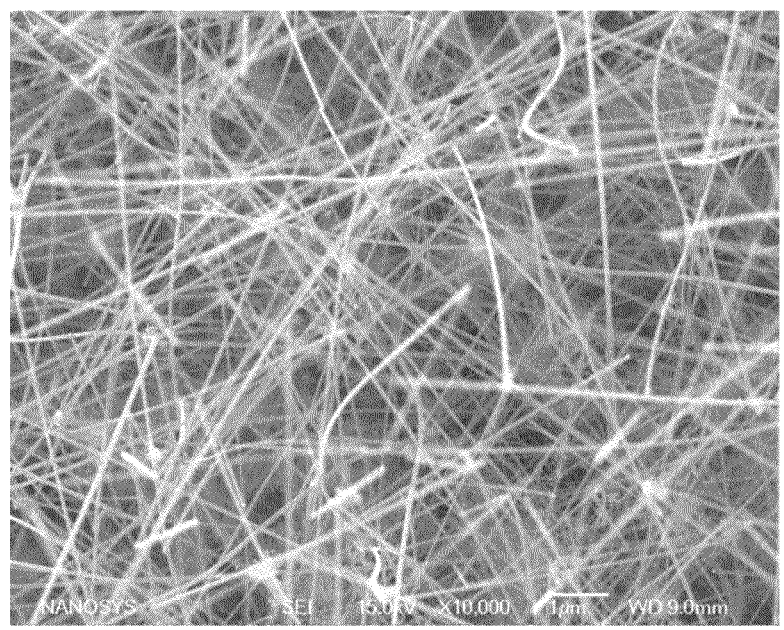
Figure 26C:
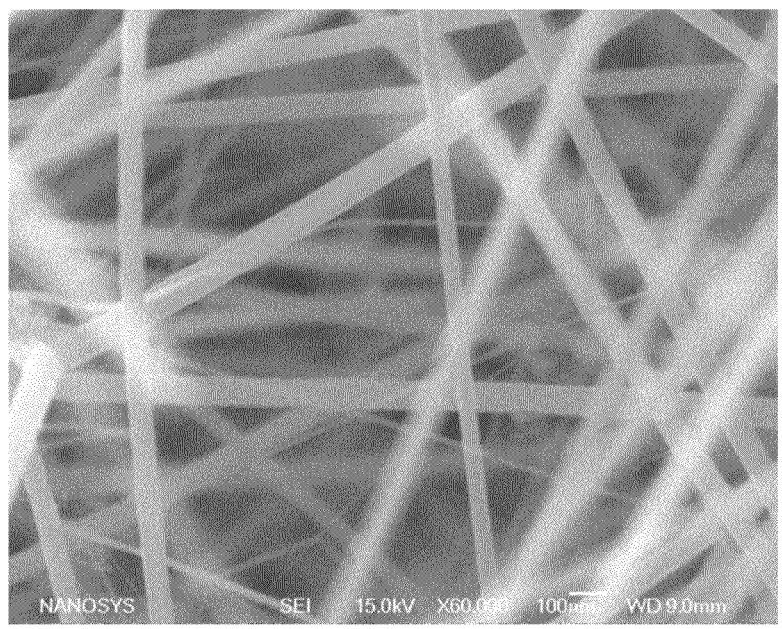

FIGS. 26A-26C show SEM micrographs of 60 nm NWs grown on a coil surface, from Trial run 202-051. FIGS. 28A-28D show SEM micrographs of 20 nm NW grown on a coil surface from Trial run 202-057.

Process Stages 10-12: Nanowire Harvesting, Filtration, and Drying

In stage 10, the nanowires are ultrasonically harvested (40 kHz sonication) by unwinding the coil and passing the unwound sheet of material through a bath of Di-H2O-10% IPA solution. The unwound sheet is placed close to a bottom surface of the bath in a horizontal orientation. For Trial run 202-051, the harvested 60 nm Si NWs in Di-H2O-10% IPA solution from had a yellow color, whereas for Trial run 202-057, the solution of 20 nm Si NWs harvested in Di-H2O-10% IPA solution had a brown color.

In stage 11, the NWs were filtered from the Di-H2O-10% IPA solution using a laboratory vacuum filter flask having a paper filter. In stage 11, the NWs captured by the filter paper were dried and then separated from the filter paper.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

All publications, patents and patent applications mentioned in this specification are indicative of the level of skill of those skilled in the art to which this invention pertains, and are herein incorporated by reference to the same extent as if each individual publication, patent or patent application was specifically and individually indicated to be incorporated by reference.

What is claimed is:

1. A method for producing nanowires, comprising:
   providing a cartridge assembly having a plurality of support layers, wherein a spacing between adjacent support layers is a set distance, and wherein each support layer has opposing first and second surfaces, wherein a plurality of catalysts are disposed on at least the first surface of each layer;

placing the cartridge assembly in a nanowire growth chamber; and providing a precursor gas in the nanowire growth chamber, whereby nanowires grow on the first surface of each layer.

2. A method for making a nanowire growth cartridge assembly, comprising:

providing a sheet of material comprising spacers, each spacer having a set height;

forming the sheet of material into a coiled sheet of material having a longitudinal axis and a plurality of support layers extending around the longitudinal axis, the plurality of support layers each having opposing first and second surfaces and being spaced apart by distances corresponding to the heights of the spacers; and disposing a plurality of catalysts on at least the first surface of each support layer.

3. A nanowire growth cartridge assembly, comprising:

a plurality of support layers wherein a spacing between adjacent support layers is a set distance, and wherein each support layer has opposing first and second surfaces; and a plurality of catalysts disposed on at least the first surface of each support layer.

4. The nanowire growth cartridge assembly of claim 3, wherein the support layers are parallel plates.

5. The nanowire growth cartridge assembly of claim 3, wherein the support layers are parallel tubes.

6. The nanowire growth cartridge assembly of claim 3, wherein the support layers are concentric tubes.

7. The nanowire growth cartridge assembly of claim 3, wherein a coiled sheet of material forms the support layers, the coiled sheet having a longitudinal axis, wherein the support layers extend around the longitudinal axis so as to be spaced apart by the set distance.

8. The nanowire growth cartridge assembly of claim 7, wherein the coiled sheet of material comprises integrated spacers embossed on the coiled sheet having a height configured to space apart the support layers by the set distance.

9. The nanowire growth cartridge assembly of claim 7, wherein the coiled sheet of material has a cross-sectional shape that is substantially circular or substantially rectangular.

10. The nanowire growth cartridge assembly of claim 7, wherein the sheet of material comprises a metal having a thickness in the range of about 5 μm to about 50 μm.

11. The nanowire growth cartridge assembly of claim 3, wherein a plurality of catalysts are disposed on the second surface of each support layer.

12. The nanowire growth cartridge assembly of claim 3, wherein the set distance between the support layers is in the range of about 30 μm to about 50 μm.

13. The nanowire growth cartridge assembly of claim 3, wherein the plurality of catalysts comprises gold colloids.

* * * * *